US009897380B2

(12) United States Patent
Matsuura et al.

(10) Patent No.: US 9,897,380 B2
(45) Date of Patent: Feb. 20, 2018

(54) CARRIER TRANSPORT SYSTEM

(71) Applicants: TOYOTA JIDOSHA KABUSHIKI KAISHA, Toyota-shi (JP); HIRATA CORPORATION, Shinagawa-ku (JP)

(72) Inventors: Masanari Matsuura, Chiryu (JP); Sotaro Oi, Saitama (JP); Tomoyuki Kubota, Yatsushiro (JP)

(73) Assignees: TOYOTA JIDOSHA KABUSHIKI KAISHA, Toyota-shi (JP); HIRATA CORPORATION, Shinagawa-ku (JP)

( * ) Notice: Subject to any disclaimer, the term of this patent is extended or adjusted under 35 U.S.C. 154(b) by 850 days.

(21) Appl. No.: 14/018,117

(22) Filed: Sep. 4, 2013

(65) Prior Publication Data

US 2014/0011149 A1 Jan. 9, 2014

Related U.S. Application Data

(62) Division of application No. 13/061,873, filed as application No. PCT/IB2009/006837 on Sep. 8, 2009, now Pat. No. 9,103,594.

(30) Foreign Application Priority Data

Sep. 10, 2008 (JP) ................................ 2008-231932

(51) Int. Cl.
*F27D 3/00* (2006.01)
*F27D 3/12* (2006.01)
(Continued)

(52) U.S. Cl.
CPC .............. *F27D 3/00* (2013.01); *F27B 9/2407* (2013.01); *F27B 9/2469* (2013.01); *F27B 9/26* (2013.01); *F27D 3/12* (2013.01)

(58) Field of Classification Search
None
See application file for complete search history.

(56) References Cited

U.S. PATENT DOCUMENTS 2,842,352 A * 7/1958 Tauber ................ C21D 9/0018 266/132
3,136,433 A 6/1964 Inghram
(Continued)

FOREIGN PATENT DOCUMENTS

JP 52 119580 9/1977
JP 1 15199 5/1989
(Continued)

OTHER PUBLICATIONS

International Search Report dated Nov. 27, 2009 in PCT/IB09/06837 filed Sep. 8, 2009.
(Continued)

*Primary Examiner* — Gregory A Wilson
(74) *Attorney, Agent, or Firm* — Oblon, McClelland, Maier & Neustadt, L.L.P.

(57) ABSTRACT

A carrier transport system transports a plurality of carriers by a transport conveyor into a heating furnace, advances a comb-shaped carrier stopper having a plurality of protrusions toward the carriers, moves the carriers by the transport conveyor in a transport direction to engage cutout grooves, provided respectively for the carriers, with the protrusions of the carrier stopper to thereby position the carriers at a time. The carrier transport system advances the carrier stopper toward the carriers to insert distal ends of the protrusions of the carrier stopper into insertion holes, and then determines, on the basis of a moved distance X of the carrier stopper, whether the carriers are properly positioned.

11 Claims, 18 Drawing Sheets

(51) Int. Cl.
*F27B 9/26* (2006.01)
*F27B 9/24* (2006.01)

(56) References Cited

U.S. PATENT DOCUMENTS

| | | | | |
|---|---|---|---|---|
| 3,225,891 | A | 12/1965 | Hickin | |
| 3,881,296 | A | 5/1975 | Bate | |
| 3,969,627 | A * | 7/1976 | Heisner | G01M 17/028 378/61 |
| 5,467,861 | A | 11/1995 | Weskamp | |
| 5,488,815 | A | 2/1996 | Abrams | |
| 5,577,593 | A | 11/1996 | Hooper | |
| 5,649,410 | A | 7/1997 | Marlin | |
| 5,687,541 | A | 11/1997 | Martin | |
| 5,814,134 | A | 9/1998 | Edwards | |
| 5,922,230 | A * | 7/1999 | Yokota | B23K 1/008 198/465.3 |
| 6,170,634 | B1 | 1/2001 | Jaquet | |
| RE37,432 | E | 11/2001 | Martin | |
| 6,423,945 | B1 * | 7/2002 | Yokota | B23K 1/008 219/388 |
| 6,437,289 | B1 * | 8/2002 | Yokota | B23K 1/008 219/388 |
| 6,460,690 | B1 | 10/2002 | Tachibana et al. | |
| 6,600,137 | B1 * | 7/2003 | Nonomura | B23K 1/012 219/388 |
| 6,719,615 | B1 * | 4/2004 | Molnar | B24B 1/005 451/262 |
| 7,377,836 | B1 * | 5/2008 | Molnar | B24B 37/013 205/640 |
| 7,456,946 | B2 | 11/2008 | Ackley | |
| 7,980,851 | B2 | 7/2011 | Takano | |
| 8,247,741 | B2 * | 8/2012 | Pepler | C23C 14/26 118/663 |
| 8,375,884 | B2 * | 2/2013 | Mizunaga | H01L 21/67109 118/319 |
| 2001/0019004 | A1 | 9/2001 | Sagane | |
| 2004/0000121 | A1 | 1/2004 | Ichikawa | |
| 2004/0037677 | A1 * | 2/2004 | Koyama | H01L 21/67173 414/222.01 |
| 2004/0094050 | A1 | 5/2004 | Ackley | |
| 2005/0126883 | A1 | 6/2005 | Leisner | |
| 2006/0099054 | A1 | 5/2006 | Friedman | |
| 2007/0023486 | A1 | 2/2007 | Matsuura | |
| 2008/0202068 | A1 | 8/2008 | Ichikawa | |
| 2009/0060686 | A1 * | 3/2009 | Morita | H01L 21/67248 414/147 |
| 2010/0089720 | A1 * | 4/2010 | Matsuura | B23K 1/005 198/345.3 |
| 2011/0165531 | A1 * | 7/2011 | Matsuura | F27B 9/2407 432/239 |
| 2011/0200321 | A1 * | 8/2011 | Takiguchi | G03B 27/52 396/577 |
| 2013/0263445 | A1 * | 10/2013 | Yokota | H05K 3/303 29/840 |
| 2014/0105716 | A1 * | 4/2014 | Lee | H01L 21/68707 414/749.1 |
| 2014/0262035 | A1 * | 9/2014 | Merry | H01L 21/6719 156/345.31 |
| 2014/0367451 | A1 * | 12/2014 | Yokota | B23K 1/008 228/47.1 |
| 2015/0014126 | A1 * | 1/2015 | Snow | B65G 29/00 198/617 |

FOREIGN PATENT DOCUMENTS

| | | |
|---|---|---|
| JP | 2 49856 | 10/1990 |
| JP | 7 81730 | 3/1995 |
| JP | 9 126660 | 5/1997 |

OTHER PUBLICATIONS

Office Action dated Feb. 28, 2014 in co-pending U.S. Appl. No. 13/061,873.

* cited by examiner

COMPARATIVE ENBODIMENT

COMPARATIVE ENBODIMENT

COMPARATIVE ENBODIMENT

CARRIER TRANSPORT SYSTEM

CROSS REFERENCE

This application is a division of and is based upon and claims the benefit of priority under 35 U.S.C. § 120 for U.S. Ser. No. 13/061,873, filed Mar. 2, 2011, the entire contents of which is incorporated herein by reference. U.S. Ser. No. 13/061,873 is a National Stage of PCT/IB09/006837, filed Sep. 8, 2009, and claims the benefit of priority under 35 U.S.C. § 119 from Japanese Patent Application No. 2008-231932, filed Sep. 10, 2008.

BACKGROUND OF THE INVENTION

1. Field of the Invention

The invention relates to a technique for positioning carriers, which are transported by a transport conveyor, in a heating furnace.

2. Description of the Related Art

Various techniques have been suggested for positioning work or a carrier transported by a transport conveyor. For example, Japanese Utility Model Publication No. 1-15199 (JP-Y-1-15199) describes a technique for positioning first one substrate by a positioning mechanism when a plurality of substrates (work) in a transport path are transported by a comb-shaped guide member having a plurality of protrusions and then the first one substrate in the transport direction reaches a predetermined position. The positioning mechanism positions a substrate using, for example, a block equipped with a piston and rollers provided at a distal end of a cylinder for guiding a substrate.

In addition, various techniques have been suggested for checking whether positioning is accurately performed. For example, Japanese Patent Publication No. 2-49856 (JP-B-2-49856) describes a technique for checking whether there is a pallet on a swiveling table. In the technique, positioning means for positioning a pallet by fitting a movable pin in a recess formed in the pallet and detecting means for detecting whether the movable pin is fitted in the recess of the pallet are provided. In this technique, one pallet is positioned by the positioning means, and then completion of the positioning may be checked by the detecting means.

However, the techniques described in JP-Y-1-15199 and JP-B-2-49856 have the following problems. That is, according to the technique described in JP-Y-1-15199, it is not checked whether a substrate is accurately positioned after the substrate has been positioned. Therefore, if the substrate is not accurately positioned because, for example, work gets caught on something, it may be impossible to, for example, process or treat the work appropriately.

In addition, in the technique described in JP-B-2-49856, completion of positioning is checked by the detecting means; however, this technique is not directed to simultaneously positioning a plurality of pallets and then checking the positioning of the plurality of pallets, there is still a problem that working efficiency is poor.

SUMMARY OF THE INVENTION

The invention provides a carrier positioning method and carrier transport system that are able to simultaneously position a plurality of carriers in a heating furnace and then check whether all the carriers are accurately positioned with a simple configuration.

A first aspect of the invention provides a carrier positioning method that transports a plurality of carriers, on which pieces of work are respectively mounted, by a transport conveyor into a heating furnace and that positions the plurality of carriers. The carrier positioning method includes: a transport process of transporting the plurality of carriers by the transport conveyor into the heating furnace; a first advance process of advancing a comb-shaped carrier stopper toward the carriers, wherein the carrier stopper has a plurality of protrusions used for positioning the carriers; a positioning process of positioning the carriers at a time at predetermined intervals in a transport direction in which the carriers are transported in such a manner that the carriers are moved by the transport conveyor in the transport direction to engage engagement portions, provided respectively for the carriers, with the protrusions of the carrier stopper; a second advance process of advancing the carrier stopper toward the carriers so as to insert distal ends of the respective protrusions of the carrier stopper into insertion holes of the engagement portions, wherein the insertion holes are provided so as to allow the distal ends of the protrusions to be inserted when the carriers are properly positioned; and a determination process of determining, on the basis of a moved distance of the carrier stopper toward the carriers, whether the carriers are properly positioned.

In the carrier positioning method according to the first aspect of the invention, the "positioning process" may be performed after the "first advance process" has been completed; instead, the "first advance process" and the "positioning process" may be performed in parallel with each other. In addition, in the carrier positioning method, the carriers may be once stopped after the "first advance process" has been completed and then the carriers may be advanced in the "second advance process" again; instead, the "first advance process" and the "second advance process" may be continuously performed. In addition, the "moved distance of the carrier stopper" may be a total moved distance of a moved distance in the "first advance process" and a moved distance in the "second advance process"; instead, the "moved distance of the carrier stopper" may be only a moved distance in the "second advance process".

In the carrier positioning method according to the first aspect of the invention, in the transport process, the plurality of carriers are transported by the transport conveyor into the heating furnace. Then, in the first advance process, the carrier stopper is advanced toward the carriers. By so doing, the plurality of protrusions of the carrier stopper may be moved to positions at which the protrusions are engageable with the engagement portions of the respective carriers. In addition, in the positioning process, the transport conveyor is moved in the transport direction to engage the plurality of protrusions of the carrier stopper with the engagement portions of the respective carriers. By so doing, the carriers may be positioned at intervals corresponding to the intervals of the protrusions of the carrier stopper. That is, in the above method, by changing the intervals of the protrusions of the carrier stopper, it is possible to position the carriers at desired positions. For example, when the carriers are positioned so that the carriers respectively face a plurality of heating devices provided in the heating furnace, it is possible to accurately heat pieces of work mounted respectively on the carriers by the heating devices without waste.

In the second advance process, the carrier stopper is advanced toward the carriers to cause the distal ends of the protrusions of the carrier stopper to be inserted into the insertion holes provided for the engagement portions of the respective carriers. The insertion holes are provided so as to allow the distal ends of the protrusions to be inserted when the carriers are properly positioned. Then, in the determination process, it is determined, on the basis of the moved distance of the carrier stopper, whether the carriers are properly positioned. Here, determination as to whether the carriers are properly positioned may, for example, include an embodiment in which it is determined that the carriers are properly positioned when the moved distance of the carrier stopper exceeds a predetermined reference value, and it is determined that the carriers are not properly positioned when the moved distance of the carrier stopper is smaller than or equal to the predetermined reference value. The reference value may be, for example, a moved distance of the carrier stopper at the time when the distal ends of the protrusions start to be inserted into the insertion holes.

In this manner, by determining whether the carriers are properly positioned, even when the carriers are not accurately positioned because, for example, the carriers get caught on something, it is possible to detect the inaccurate positioning and then position the carriers again. By so doing, it is possible to, for example, appropriately process or treat pieces of work mounted respectively on the carriers. In addition, the plurality of carriers may be positioned at a time and then the positioning may be checked, so working efficiency is favorable.

In addition, with the carrier positioning method according to the first aspect of the invention, a moved distance of the carrier stopper is detected to check whether positioning is accurately performed. Thus, a plurality of position detecting means (position sensors, or the like) corresponding to the respective carriers are not required. That is, even when the plurality of carriers are positioned in the heating furnace, it is not necessary to ensure a large space in the chamber side surface of the heating furnace to form a plurality of quartz windows. As a result, it is possible to position the plurality of carriers in the heating furnace at a time and to check whether all the carriers are positioned accurately with a simple configuration.

In addition, in the carrier positioning method according to the first aspect, the engagement portions of the carriers may be cutout grooves that are wider in the transport direction of the carriers than the protrusions, in the first advance process, the carrier stopper may be advanced toward the carriers to insert the protrusions of the carrier stopper into the cutout grooves, and in the positioning process, the carriers may be moved by the transport conveyor in the transport direction to engage rear end surfaces in the transport direction of the cutout grooves with the protrusions of the carrier stopper, whereby the carriers are positioned.

In this way, the engagement portions are formed of cutout grooves that are wider in the transport direction of the carriers than the protrusions. Thus, the protrusions of the carrier stopper may be inserted into the cutout grooves, and the carriers may be transported to engage the rear end surfaces in the transport direction of the cutout grooves with the protrusions of the carrier stopper. Therefore, it is possible to easily implement the carrier positioning method according to the first aspect. That is, it is possible to position the plurality of carriers in the heating furnace at a time with a simple configuration.

In addition, in the carrier positioning method according to the first aspect, the insertion holes may be provided at rear end portions in the transport direction of the respective cutout grooves, and, in the determination process, it may be determined, on the basis of the moved distance of the carrier stopper toward the carriers after the carriers have been moved in the transport direction in the positioning process, whether the carriers are properly positioned.

In addition, in the carrier positioning method according to the first aspect, the insertion holes may be provided at rear end portions in the transport direction of the respective cutout grooves, and, in the determination process, it may be determined that the carriers are not properly positioned when the moved distance of the carrier stopper toward the carriers is smaller than or equal to a predetermined reference value.

In addition, in the carrier positioning method according to the first aspect, when it is determined in the determination process that the carriers are not properly positioned, the carriers may be positioned again.

A second aspect of the invention provides a carrier transport system. The carrier transport system includes: a plurality of carriers on which pieces of work are respectively mounted; a transport conveyor that transports the plurality of carriers; a heating furnace that covers part of the transport conveyor and that heats the pieces of work; and positioning means that positions the plurality of carriers in the heating furnace, wherein the heating furnace includes a plurality of heating devices for heating the pieces of work inside so that the plurality of heating devices are arranged at predetermined intervals in a transport direction in which the carriers are transported, each of the carriers has at least one engagement portion, and the positioning means includes a comb-shaped carrier stopper having a plurality of protrusions that are engageable with the engagement portions of the respective carriers; actuating means that moves the carrier stopper toward the carriers in order to engage the protrusions with the engagement portions; moved distance detecting means that detects a moved distance of the carrier stopper moved by the actuating means; and determination means that determines, on the basis of the moved distance detected by the moved distance detecting means, whether the carriers are properly positioned.

Here, the "moved distance of the carrier stopper" may be a total moved distance of a moved distance in the "first advance process" and a moved distance in the "second advance process" as in the case of the above; instead, the "moved distance of the carrier stopper" may be only a moved distance in the "second advance process".

In the carrier transport system according to the second aspect, the plurality of carriers are transported by the transport conveyor into the heating furnace. The plurality of heating devices for heating pieces of work are arranged in the heating furnace at predetermined intervals in the transport direction of the carriers. Then, after the carriers have been transported into the heating furnace, the carrier stopper is advanced toward the carriers by the actuating means, and then the carriers are moved by the transport conveyor in the transport direction. By so doing, it is possible to engage the plurality of protrusions of the carrier stopper with the engagement portions of the respective carriers. As a result, it is possible to position the carriers at intervals corresponding to the intervals of the protrusions of the carrier stopper. Here, in the carrier transport system according to the second aspect, by changing the intervals of the protrusions of the carrier stopper, it is possible to position the carriers at desired positions. Thus, by positioning the carriers so that the carriers respectively face the plurality of heating devices provided in the heating furnace, it is possible to accurately heat pieces of work mounted respectively on the carriers by the heating devices without waste. Note that in the carrier transport system according to the second aspect, the carriers may be positioned after the carrier stopper has been once advanced; instead, the carriers may be positioned while the carrier stopper is being advanced.

Then, in the carrier transport system according to the second aspect, it may be determined by the determination means on the basis of a moved distance of the carrier stopper whether the carriers are properly positioned. Note that, as in the case of the above, "determination as to whether the carriers are properly positioned" may, for example, include an embodiment in which it is determined that the carriers are properly positioned when the moved distance of the carrier stopper exceeds a predetermined reference value, and it is determined that the carriers are not properly positioned when the moved distance of the carrier stopper is smaller than or equal to the predetermined reference value. In this manner, by determining whether the carriers are properly positioned, even when the carriers are not accurately positioned because, for example, the carriers get caught on something, it is possible to detect the inaccurate positioning and then position the carriers again. By so doing, it is possible to, for example, appropriately process or treat pieces of work mounted respectively on the carriers. In addition, the plurality of carriers may be positioned at a time and then the positioning may be checked, so working efficiency is favorable.

In addition, with the carrier transport system according to the second aspect, a moved distance of the carrier stopper is detected to check whether positioning is accurately performed. Thus, a plurality of position detecting means (position sensors, or the like) corresponding to the respective carriers are not required. That is, even when the plurality of carriers are positioned in the heating furnace, it is not necessary to ensure a large space in the chamber side surface of the heating furnace to form a plurality of quartz windows. As a result, it is possible to position the plurality of carriers in the heating furnace at a time and to check whether all the carriers are positioned accurately with a simple configuration.

In the carrier transport system according to the second aspect, the engagement portions of the carriers may be cutout grooves that are wider in the transport direction of the carriers than the protrusions, rear end portions in the transport direction of the cutout grooves may respectively have insertion holes that allow distal ends of the protrusions to be inserted, and the actuating means may advance the carrier stopper so as to engage the protrusions with the cutout grooves and insert the distal ends of the protrusions into the insertion holes in coordination with transport operation of the transport conveyor.

In addition, in the carrier transport system according to the second aspect, after the protrusions are moved by the actuating means to be inserted into the cutout grooves, the transport conveyor may be transported to engage the rear end surfaces in the transport direction of the cutout grooves of the carriers with the protrusions, and then the protrusions may be moved by the actuating means toward the carriers again to insert the distal ends of the protrusions into the insertion holes.

In addition, the carrier transport system according to the second aspect may further include: a proximity detection sensor that detects proximity of the carriers; and control means that controls the actuating means to drive the carrier stopper on the basis of information detected by the proximity detection sensor.

With the carrier transport system according to the second aspect, the proximity of the carriers transported by the transport conveyor is detected by the proximity detection sensor, and it is possible to accurately determine that the carriers are transported to the predetermined positions on the basis of the detected information. Thus, the carrier stopper may be advanced toward the carriers at an adequate timing. As a result, it is possible to prevent interference between the carrier stopper and the carriers and accurately position the carriers.

In the carrier transport system according to the second aspect, the engagement portion of each carrier may be provided at each end in a direction that intersects with the transport direction, and the carrier stopper may be provided on each side in a direction that intersects with the transport direction.

In this way, the engagement portion of each carrier is provided at each end in a direction that intersects with the transport direction, and the carrier stopper is provided on each side in a direction that intersects with the transport direction. Thus, it is possible to position the carriers from both sides with respect to the transport direction. By so doing, it is possible to further accurately position the carriers.

In the carrier transport system according to the second aspect, the actuating means may advance at least one of the carrier stoppers, located on both sides, toward the carriers to hold the carriers by the carrier stoppers located on both sides.

In this way, the actuating means advances at least one of the carrier stoppers, located on both sides, toward the carriers to hold the carriers by the carrier stoppers located on both sides. Thus, it is possible to position the carriers in the direction that intersects with the transport direction. Thus, the pieces of work mounted respectively on the carriers may be further accurately arranged so that the pieces of work respectively face the heating devices in the heating furnace. As a result, the pieces of work may be further adequately heated without waste.

In the carrier transport system according to the second aspect, at least one of the carrier stoppers located on both sides may further include a rotation preventing portion that contacts parts of the carriers to prevent rotation of the carriers.

With the carrier transport system according to the second aspect, when the carriers rotate, the carriers contact the rotation preventing portion that is provided for at least one of the carrier stoppers located on both sides. Thus, rotation of the carriers is suppressed. Thus, the pieces of work mounted respectively on the carriers may be further accurately arranged so that the pieces of work respectively face the heating devices in the heating furnace. As a result, the pieces of work may be further adequately heated without waste.

With the carrier positioning method or the carrier transport system according to the aspect of the invention, as described above, it is possible to simultaneously position a plurality of carriers in a heating furnace and then check whether all the carriers are accurately positioned with a simple configuration.

BRIEF DESCRIPTION OF THE DRAWINGS

The features, advantages, and technical and industrial significance of this invention will be described in the following detailed description of example embodiments of the invention with reference to the accompanying drawings, in which like numerals denote like elements, and wherein.

DETAILED DESCRIPTION OF EMBODIMENTS

Figure 1:
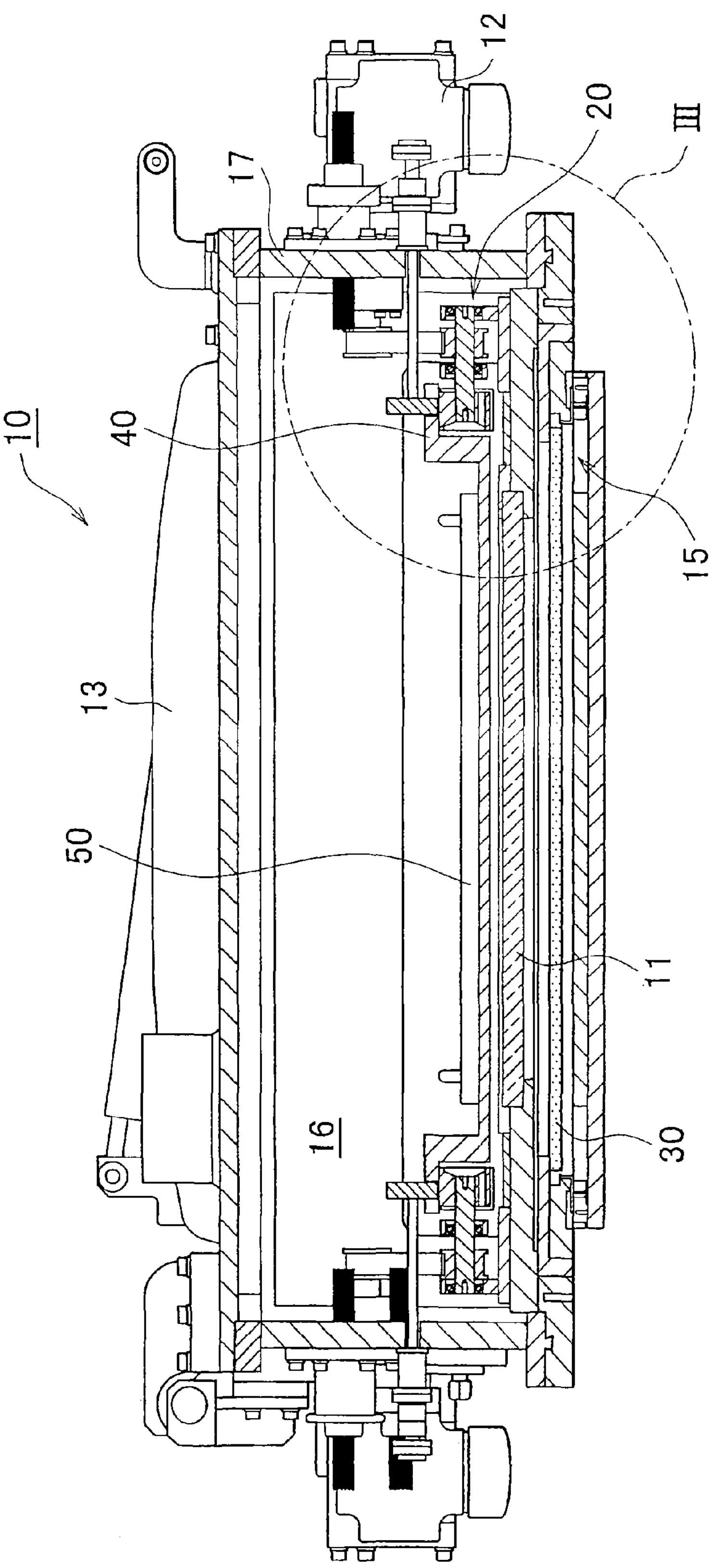
FIG. 1 is a cross-sectional view that shows the schematic configuration of a carrier transport system according to a first embodiment of the invention.

Hereinafter, a carrier positioning method and carrier transport system according to aspects of the invention will be schematically described, and specific embodiments of the carrier positioning method and carrier transport system will be described.

First, the carrier positioning method according to a first aspect of the invention will be schematically described. The carrier positioning method according to the first aspect of the invention transports a plurality of carriers, on which pieces of work are respectively mounted, by a transport conveyor into a heating furnace and positions the plurality of carriers. The carrier positioning method includes: a transport process of transporting the plurality of carriers by the transport conveyor into the heating furnace; a first advance process of advancing a comb-shaped carrier stopper toward the carriers, wherein the carrier stopper has a plurality of protrusions used for positioning the carriers; a positioning process of positioning the carriers at a time at predetermined intervals in a transport direction in which the carriers are transported in such a manner that the carriers are moved by the transport conveyor in the transport direction to engage engagement portions, provided respectively for the carriers, with the protrusions of the carrier stopper; a second advance process of advancing the carrier stopper toward the carriers so as to insert distal ends of the respective protrusions of the carrier stopper into insertion holes of the engagement portions, wherein the insertion holes are provided so as to allow the distal ends of the protrusions to be inserted when the carriers are properly positioned; and a determination process of determining, on the basis of a moved distance of the carrier stopper toward the carriers, whether the carriers are properly positioned.

In the carrier positioning method according to the first aspect of the invention, the "positioning process" may be performed after the "first advance process" has been completed; instead, the "first advance process" and the "positioning process" may be performed in parallel with each other. In addition, in the carrier positioning method, advance of the carriers may be once stopped after the "first advance process" has been completed and then the carriers may be advanced in the "second advance process" again; instead, the "first advance process" and the "second advance process" may be continuously performed. In addition, the "moved distance of the carrier stopper" may be a total moved distance of a moved distance in the "first advance process" and a moved distance in the "second advance process"; instead, the "moved distance of the carrier stopper" may be only a moved distance in the "second advance process".

In the carrier positioning method according to the first aspect of the invention, in the transport process, the plurality of carriers are transported by the transport conveyor into the heating furnace. Then, in the first advance process, the carrier stopper is advanced toward the carriers. By so doing, the plurality of protrusions of the carrier stopper may be moved to positions at which the protrusions are engageable with the engagement portions of the respective carriers. In addition, in the positioning process, the transport conveyor is moved in the transport direction to engage the plurality of protrusions of the carrier stopper with the engagement portions of the respective carriers. By so doing, the carriers may be positioned at intervals corresponding to the intervals of the protrusions of the carrier stopper. That is, in the above method, by changing the intervals of the protrusions of the carrier stopper, it is possible to position the carriers at desired positions. For example, when the carriers are positioned so that the carriers respectively face a plurality of heating devices provided in the heating furnace, it is possible to accurately heat pieces of work mounted respectively on the carriers by the heating devices without waste.

In the second advance process, the carrier stopper is advanced toward the carriers to cause the distal ends of the protrusions of the carrier stopper to be inserted into the insertion holes provided for the engagement portions of the respective carriers. The insertion holes are provided so as to allow the distal ends of the protrusions to be inserted when the carriers are properly positioned. Then, in the determination process, it is determined, on the basis of the moved distance of the carrier stopper, whether the carriers are properly positioned. Here, determination as to whether the carriers are properly positioned may, for example, include an embodiment in which it is determined that the carriers are properly positioned when the moved distance of the carrier stopper exceeds a predetermined reference value, and it is determined that the carriers are not properly positioned when the moved distance of the carrier stopper is smaller than or equal to the predetermined reference value. The reference value may be, for example, a moved distance of the carrier stopper at the time when the distal ends of the protrusions start to be inserted into the insertion holes.

In this manner, by determining whether the carriers are properly positioned, even when the carriers are not accurately positioned because, for example, the carriers get caught on something, it is possible to detect the inaccurate positioning and then position the carriers again. By so doing, it is possible to, for example, appropriately process or treat pieces of work mounted respectively on the carriers. In addition, the plurality of carriers may be positioned at a time and then the positioning may be checked, so working efficiency is favorable.

Figure 16:
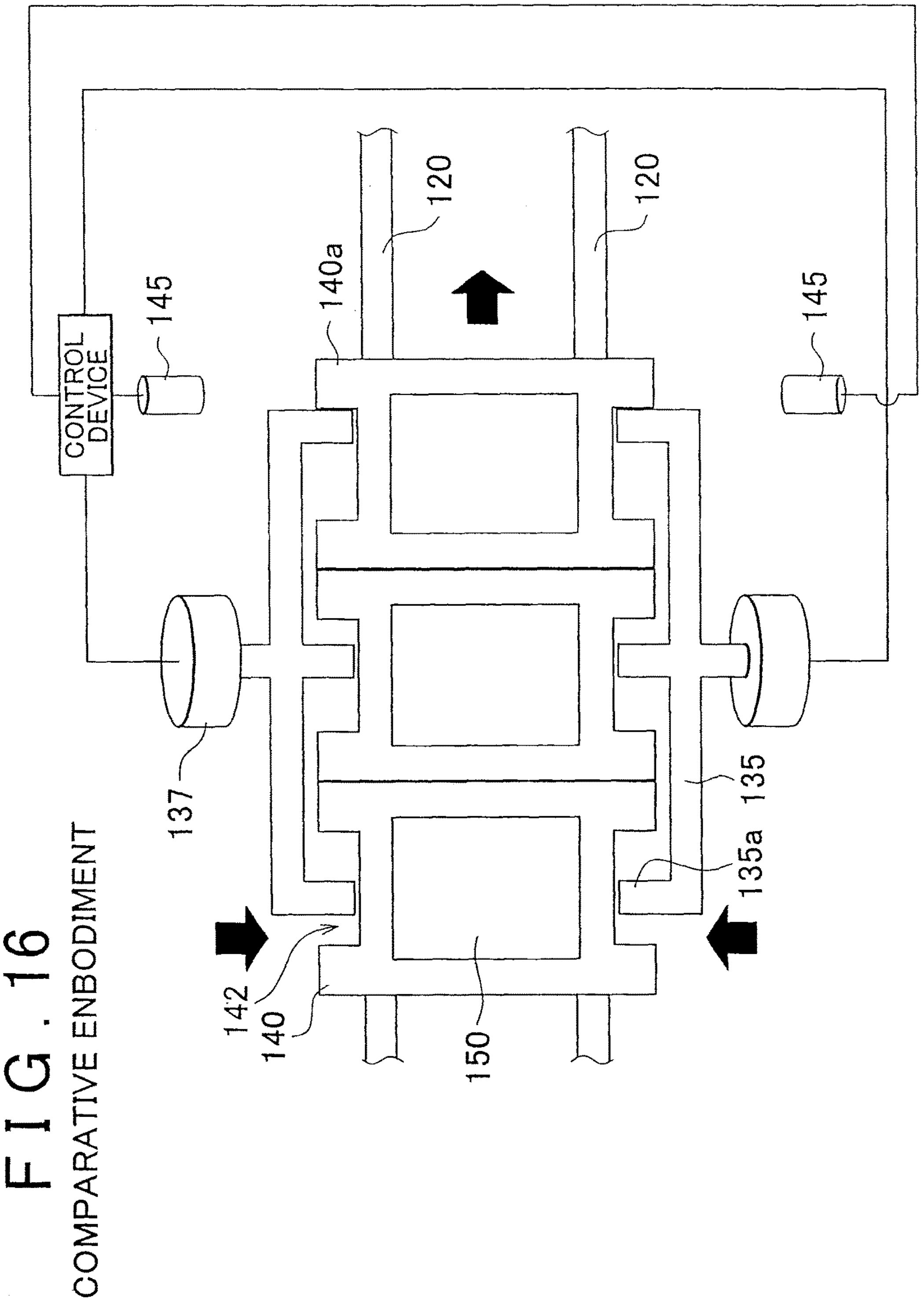
FIG. 16 is a view that illustrates a method of positioning carriers according to a comparative embodiment of the invention.

On the other hand, as shown in FIG. 16, the inventors have an idea (comparative embodiment) that there is provided a plurality of carriers 140 on which pieces of work 150 are respectively mounted, transport conveyors 120 that transport the plurality of carriers 140, comb-shaped carrier stoppers 135 having a plurality of protrusions 135*a* for positioning the carriers 140 at predetermined intervals, cylinders 137 and position sensors 145 that detect a position of a first one carrier 140*a*, and then the protrusions 135*a* of the carrier stoppers 135 are respectively engaged with cutout grooves 142 formed in the carriers 140 to position the plurality of carriers 140 at a time at the predetermined intervals.

Figure 17:
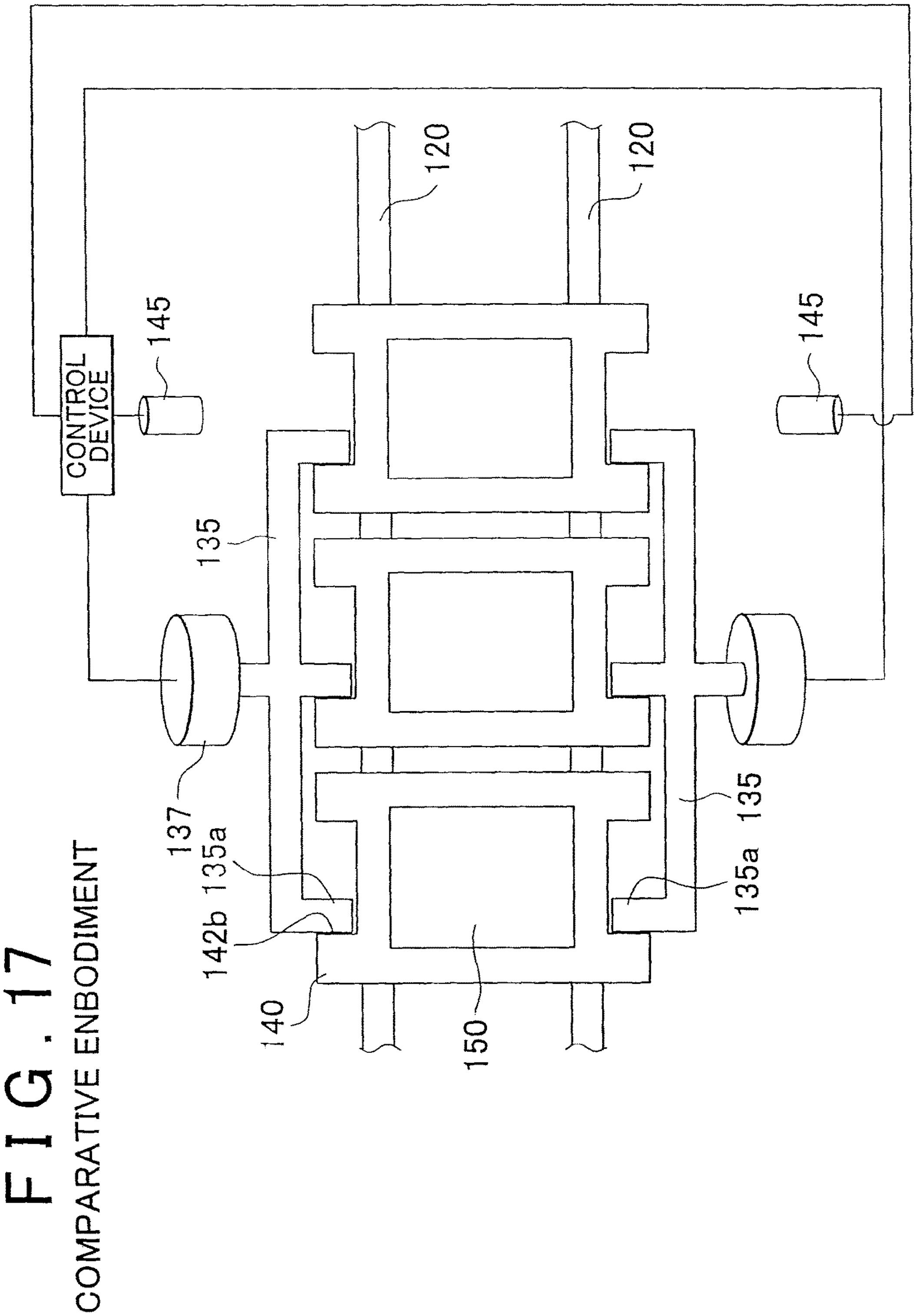
FIG. 17 is a view that illustrates the method of positioning carriers according to the comparative embodiment of the invention.
Figure 18:
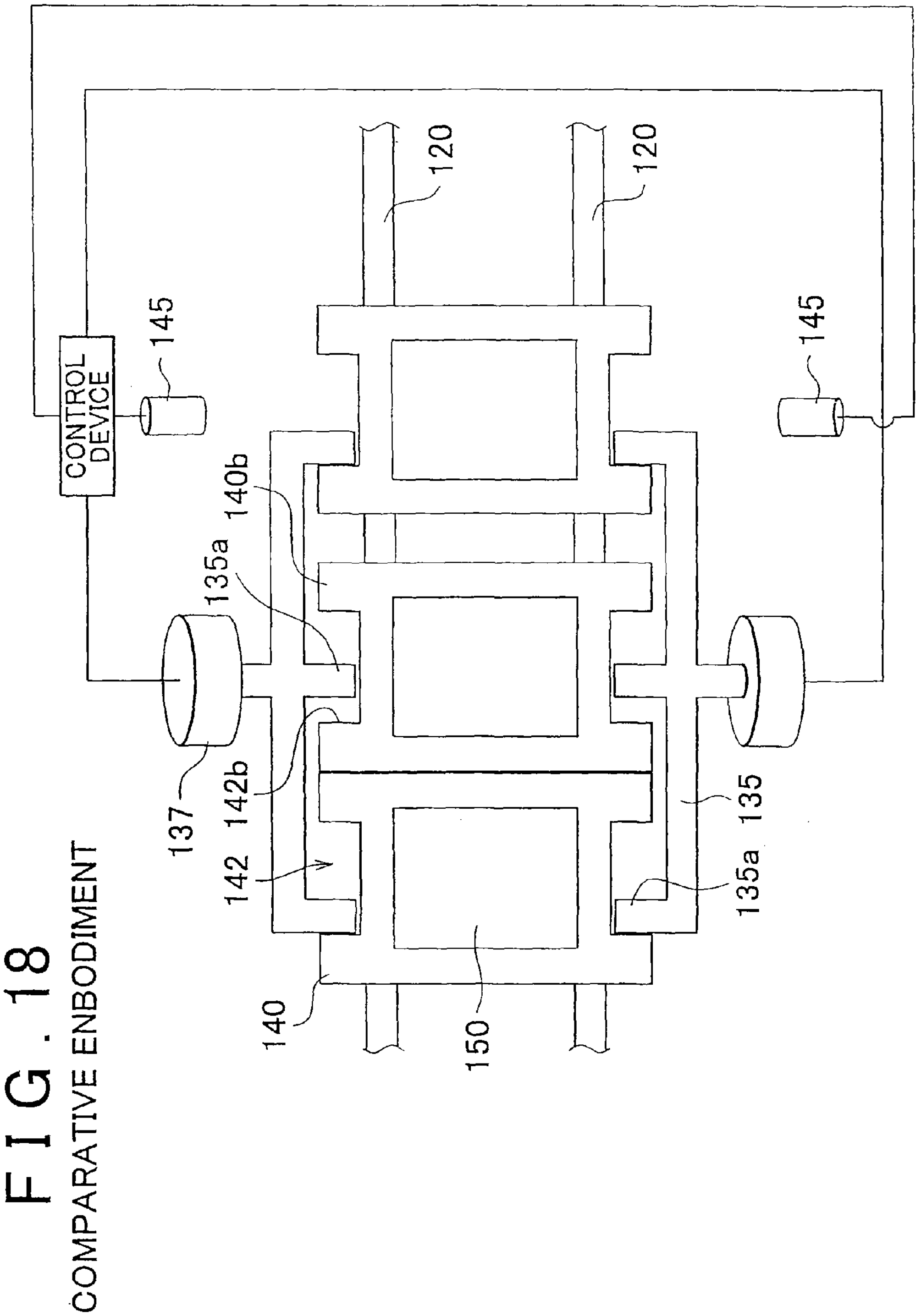
FIG. 18 is a view that illustrate the method of positioning the carriers according to the comparative embodiment of the invention.

In this technique, as shown in FIG. 17, by transporting the carriers 140 by the transport conveyors 120, it is possible to engage the protrusions 135*a* of the carrier stoppers 135 with rear end surfaces 142*b* in the transport direction of the cutout grooves 142 of the respective carriers 140. By so doing, it is possible to position the carriers 140 at the predetermined intervals. Then, the position of the first one carrier 140*a* is checked by the position sensors 145 to make it possible to check whether the carriers 140 are positioned. However, according to the above technique, as shown in FIG. 18, when a carrier 140*b*, for example, gets caught on something, the rear end surfaces 142*b* of the cutout grooves 142 of the carrier 140*b* may not accurately engage with the protrusions 135*a* of the carrier stoppers 135. That is, the carrier 140*b* may not be positioned accurately. Therefore, in the above technique, it may be difficult to accurately detect whether all the carriers 140 are accurately positioned.

On the other hand, it is also conceivable that a plurality of position sensors 145 are provided in correspondence with the respective carriers 140 to check whether the carriers 140 are positioned. However, in this case, the configuration of the system is complex and, in addition, it is necessary to ensure a space for providing the plurality of position sensors 145. Particularly, when the plurality of carriers are positioned in the heating furnace, it is difficult to ensure a large space in the chamber side surfaces of the heating furnace. In addition, even when a sufficient space may be ensured in the chamber side surfaces of the heating furnace, it is necessary to form a plurality of quartz windows in the chamber side surfaces. This makes the configuration of the system complex to increase manufacturing cost.

In contrast, with the carrier positioning method according to the first aspect of the invention, it is impossible to insert the distal end of the protrusion of the carrier stopper into the insertion hole of the carrier that is not properly positioned, so the carrier stopper cannot be advanced toward the carriers until all the carriers are positioned accurately. Thus, different from the comparative embodiment, even when only one of the carriers is inaccurately positioned, it is possible to detect that the carrier is not positioned accurately. That is, it is possible to determine whether all the carriers are properly positioned accurately.

Next, a carrier transport system according to a second aspect of the invention will be schematically described. The carrier transport system according to the second aspect of the invention includes: a plurality of carriers on which pieces of work are respectively mounted; a transport conveyor that transports the plurality of carriers; a heating furnace that covers part of the transport conveyor and that heats the pieces of work; and positioning means that positions the plurality of carriers in the heating furnace, wherein the heating furnace includes a plurality of heating devices for heating the pieces of work inside so that the plurality of heating devices are arranged at predetermined intervals in a transport direction in which the carriers are transported, each of the carriers has at least one engagement portion, and the positioning means includes a comb-shaped carrier stopper having a plurality of protrusions that are engageable with the engagement portions of the respective carriers; actuating means that moves the carrier stopper toward the carriers in order to engage the protrusions with the engagement portions; moved distance detecting means that detects a moved distance of the carrier stopper moved by the actuating means; and determination means that determines, on the basis of the moved distance detected by the moved distance detecting means, whether the carriers are properly positioned.

Here, the "moved distance of the carrier stopper" may be a total moved distance of a moved distance in the "first advance process" and a moved distance in the "second advance process" as in the case of the above; instead, the "moved distance of the carrier stopper" may be only a moved distance in the "second advance process".

In the carrier transport system according to the second aspect, the plurality of carriers are transported by the transport conveyor into the heating furnace. The plurality of heating devices for heating pieces of work are arranged in the heating furnace at predetermined intervals in the transport direction of the carriers. Then, after the carriers have been transported into the heating furnace, the carrier stopper is advanced toward the carriers by the actuating means, and then the carriers are moved by the transport conveyor in the transport direction. By so doing, it is possible to engage the plurality of protrusions of the carrier stopper with the engagement portions of the respective carriers. As a result, it is possible to position the carriers at intervals corresponding to the intervals of the protrusions of the carrier stopper. Here, in the carrier transport system according to the second aspect, by changing the intervals of the protrusions of the carrier stopper, it is possible to position the carriers at desired positions. Thus, by positioning the carriers so that the carriers respectively face the plurality of heating devices provided in the heating furnace, it is possible to accurately heat pieces of work mounted respectively on the carriers by the heating devices without waste. Note that in the carrier transport system according to the second aspect, the carriers may be positioned after the carrier stopper has been once advanced; instead, the carriers may be positioned while the carrier stopper is being advanced.

Then, in the carrier transport system according to the second aspect, it may be determined by the determination means on the basis of a moved distance of the carrier stopper whether the carriers are properly positioned. Note that, as in the case of the above, "determination as to whether the carriers are properly positioned" may, for example, include an embodiment in which it is determined that the carriers are properly positioned when the moved distance of the carrier stopper exceeds a predetermined reference value, and it is determined that the carriers are not properly positioned when the moved distance of the carrier stopper is smaller than or equal to the predetermined reference value. In this manner, by determining whether the carriers are properly positioned, even when the carriers are not accurately positioned because, for example, the carriers get caught on something, it is possible to detect the inaccurate positioning and then position the carriers again. By so doing, it is possible to, for example, appropriately process or treat pieces of work mounted respectively on the carriers. In addition, the plurality of carriers may be positioned at a time and then the positioning may be checked, so working efficiency is favorable.

In addition, with the carrier transport system according to the second aspect, a moved distance of the carrier stopper is detected to check whether positioning is accurately performed. Thus, a plurality of position detecting means (position sensors, or the like) corresponding to the respective carriers are not required. That is, even when the plurality of carriers are positioned in the heating furnace, it is not necessary to ensure a large space in the chamber side surface of the heating furnace to form a plurality of quartz windows. As a result, it is possible to position the plurality of carriers in the heating furnace at a time and to check whether all the carriers are positioned accurately with a simple configuration.

In the carrier transport system according to the second aspect, the engagement portions of the carriers may be cutout grooves that are wider in the transport direction of the carriers than the protrusions, rear end portions in the transport direction of the cutout grooves may respectively have insertion holes that allow distal ends of the protrusions to be inserted, and the actuating means may advance the carrier stopper so as to engage the protrusions with the cutout grooves and insert the distal ends of the protrusions into the insertion holes in coordination with transport operation of the transport conveyor.

In this way, by forming the cutout grooves of the carriers so as to be wider in the transport direction of the carriers than the protrusions of the carrier stopper, it is possible to easily insert the protrusions into the cutout grooves when the carrier stopper is advanced toward the carriers. In addition, by forming the insertion holes, which allow the distal ends of the protrusions to be inserted, at the rear end portions in the transport direction of the cutout grooves, it is possible to further advance the carrier stopper toward the carriers to insert the distal ends of the protrusions into the insertion holes in a state where the carriers are positioned so that the protrusions are engaged with the rear end surfaces in the transport direction of the cutout grooves. With the above configuration, it is possible to easily determine, on the basis of a moved distance of the carrier stopper, whether the carriers have been positioned. Specifically, with the above system, it is impossible to insert the distal end of the protrusion of the carrier stopper into the insertion hole that is not properly positioned. Therefore, the carrier stopper cannot be advanced toward the carriers unless all the carriers are positioned accurately. Thus, different from the comparative embodiment, even when only one of the carriers is inaccurately positioned, it is possible to detect that the carrier is not positioned accurately. That is, it is possible to position the plurality of carriers in the heating furnace at a time and to check whether all the carriers are positioned accurately with a simple configuration.

Hereinafter, specific embodiments of the carrier positioning method and carrier transport system according to the aspect of the invention will be described in detail with reference to the accompanying drawings. The carrier positioning method and the carrier transport system position carriers transported by a transport conveyor into a heating furnace and then heat pieces of work mounted respectively on the carriers.

A carrier transport system according to a first embodiment will be described with reference to FIG. 1. FIG. 1 is a cross-sectional view that shows the schematic configuration of the carrier transport system according to the first embodiment of the invention. As shown in FIG. 1, the carrier transport system 10 includes carriers 40 on which pieces of work 50 are respectively mounted, transport conveyors 20 that transports the carriers 40, a heating furnace 13 that covers part of the transport conveyors 20 and heats the pieces of work 50, and a positioning mechanism (an example of the positioning means according to the aspect of the invention) that positions the plurality of carriers 40 in the heating furnace 13.

The heating furnace 13 includes a chamber 17, which forms a furnace body, and halogen heaters 30 (an example of the heating device according to the aspect of the invention) that respectively heat the pieces of work 50. The inside of the chamber 17 is partitioned by a quartz glass 11 into an upper space and a lower space. Then, the space above the quartz glass 11 is a heating chamber 16, and the space below the quartz glass 11 is a decompression chamber 15. The heating chamber 16 is filled with inert gas, such as nitrogen. The plurality of halogen heaters 30 for heating the pieces of work 50 are provided in the decompression chamber 15 at predetermined intervals. For example, in the present embodiment, six halogen heaters 30 (not illustrated in the drawing) are provided in the heating furnace 13 at equal intervals in the transport direction of the carriers. Then, the carriers 40 are positioned by the positioning mechanism, which will be described later, so that the carriers 40 respectively face the halogen heaters 30. That is, the carrier transport system 10 according to the present embodiment is able to handle six pieces of work at a time inside the heating furnace 13. Note that the number of pieces of work handled in the heating furnace 13 is determined on the basis of a relationship between the size of the heating furnace 13 and the size of each piece of work 50, so the number of pieces of work handled may be changed by changing the design where necessary. However, heating process requires several minutes, so the number of pieces of work handled is desirably increased as much as possible to improve working efficiency.

Each halogen heater 30 is a typical halogen heater in which a quartz glass tube is filled with halogen gas and a tungsten filament is provided in the quartz glass tube. The halogen heaters 30 are used to irradiate infrared rays to the pieces of work 50 to make it possible to heat the pieces of work 50. The halogen heaters 30 are fixed in the decompression chamber 15. On the other hand, the transport conveyors 20 are provided in the heating chamber 16. Thus, the halogen heaters 30 and the transport conveyors 20 are isolated by the quartz glass plate 11. By so doing, it is possible to prevent dust, or the like, produced because of driving of the transport conveyors 20 from entering the halogen heaters 30. Note that in the above system, the decompression chamber 15 is desirably filled with inert gas, such as nitrogen, to suppress degradation of the halogen heaters 30.

Figure 2:
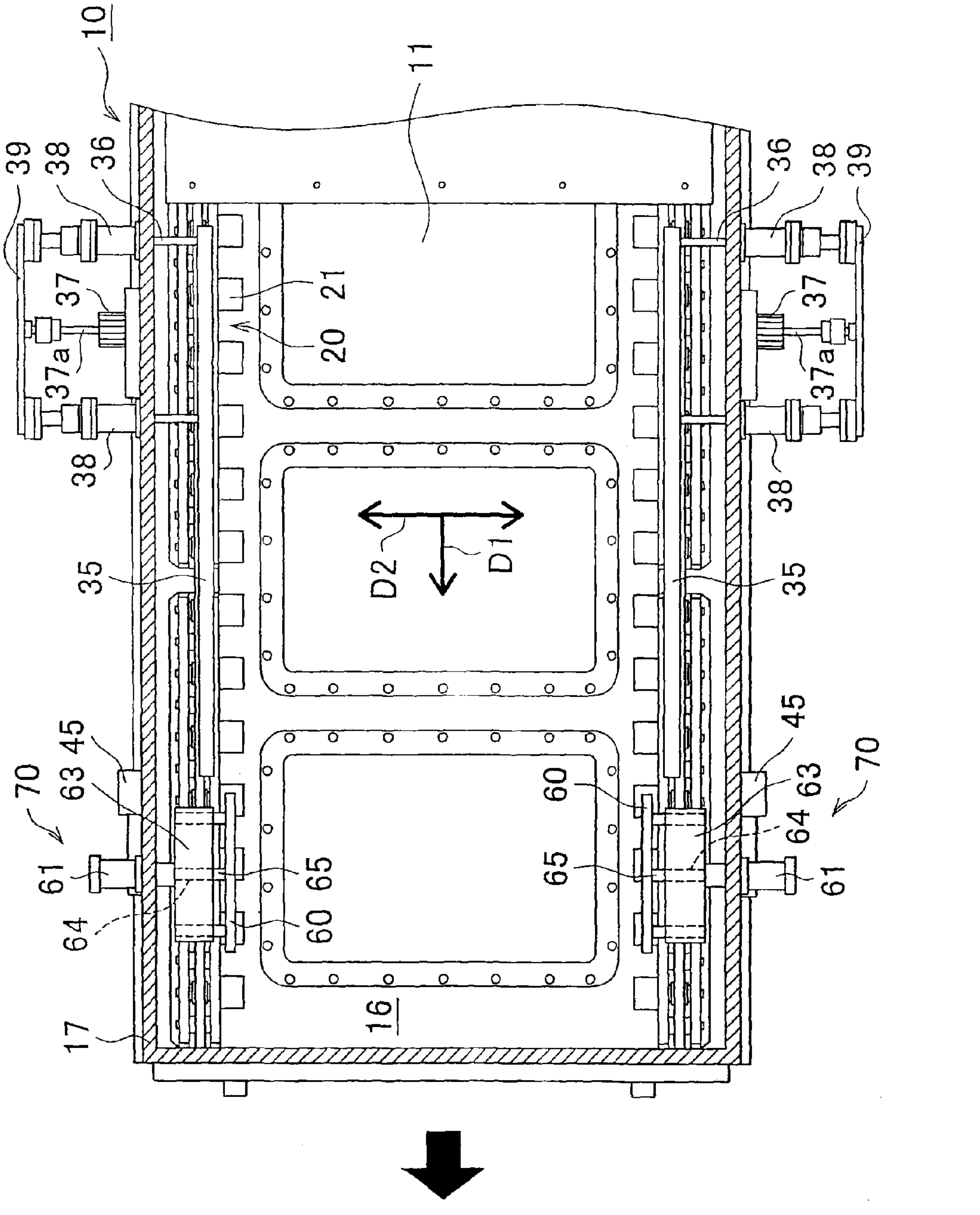
FIG. 2 is a plan view that shows the inside of the carrier transport system according to the first embodiment of the invention.
Figure 3:
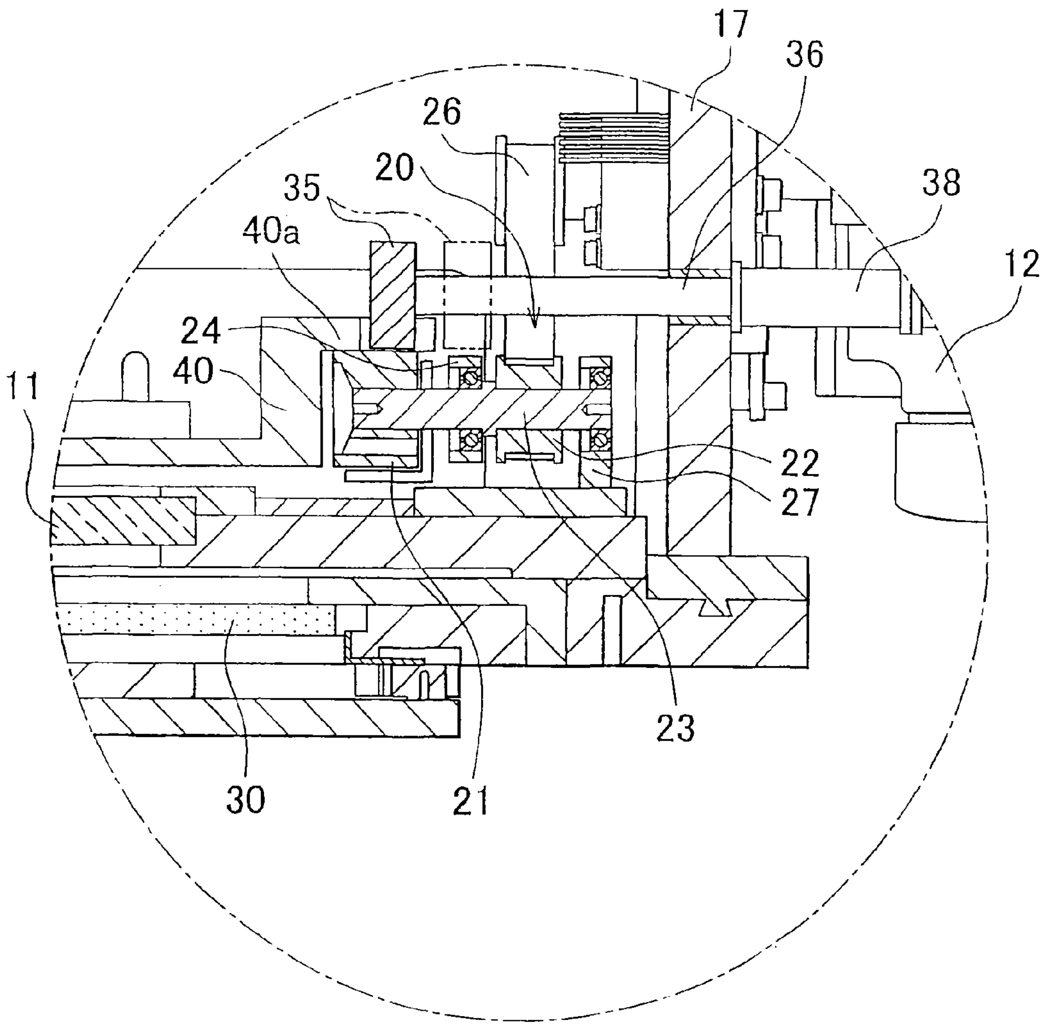
FIG. 3 is an enlarged view that shows a transport conveyor provided for the carrier transport system according to the first embodiment of the invention.

The transport conveyors 20 will be described with reference to FIG. 2 and FIG. 3. FIG. 2 is a plan view that shows the inside of the carrier transport system according to the present embodiment, FIG. 3 is an enlarged view of the portion indicated at III of FIG. 1 that shows the transport conveyor provided for the carrier transport system according to the present embodiment. As shown in FIG. 2, the transport conveyors 20 are provided respectively at both sides in a direction D2 perpendicular to the transport direction D1 in the heating chamber 16. More specifically, the transport conveyors 20 are provided parallel to the transport direction D1 over a range from a carrier entrance of the chamber 17 to a carrier exit of the chamber 17, Each of the transport conveyors 20 includes transport rollers 21 and a drive motor 12 (see FIG. 1). The transport rollers 21 are used to transport the carriers 40. The drive motor 12 is used to drive the transport rollers 21.

As shown in FIG. 3, the drive motor 12 transmits driving force to rotary shafts 23 via a belt 26 and drive pulleys 22. Each rotary shaft 23 is rotatably supported by bearings provided respectively on a partition wall 24 and a support wall 27. Then, each transport roller 21 is fixed to one end of a corresponding one of the rotary shafts 23. From the above configuration, by driving the drive motor 12, the transport rollers 21 may be rotated.

Each transport roller 21 is made of stainless steel (for example, SUS304L) of which the content of carbon is low in the material in consideration of hydrogen brittleness, or the like. As shown in FIG. 2, a line of the transport rollers 21 are provided at each end in the heating chamber 16 so as to be aligned in the transport direction D1 of the carriers 40. More specifically, as shown in FIG. 3, each transport roller 21 is arranged at a position distanced from the quartz glass plate 11. In addition, each drive pulley 22 is arranged on the outer side of the transport roller 21 (on a side away from the quartz glass plate 11 and the halogen heater 30). This is because the belt 26 wound around each drive pulley 22 is made of resin and is poor heat-resistant. For this reason, the drive pulleys 22 and the belt 26 are desirably arranged on the outer side as much as possible. In addition, in terms of heating efficiency, the inside of the heating furnace 13 is desirably made compact as much as possible.

Figure 4:
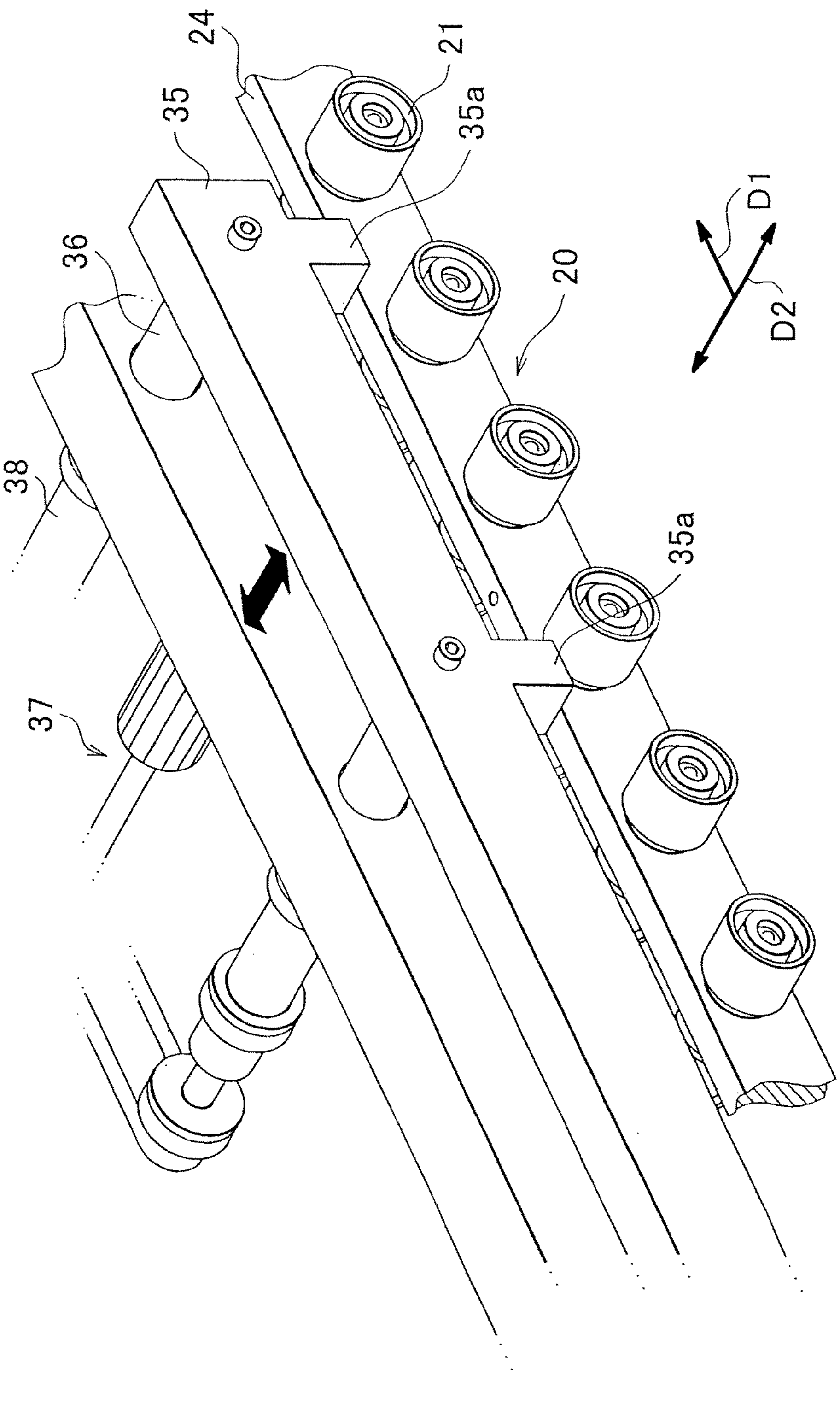
FIG. 4 is a perspective view that shows the transport conveyor provided for the carrier transport system according to the first embodiment of the invention.

The positioning mechanism will be described with reference to FIG. 4. FIG. 4 is a perspective view that shows the positioning mechanism provided for the carrier transport system according to the present embodiment. As shown in FIG. 4, the positioning mechanism includes carrier stoppers 35, cylinders 37 (an example of the actuating means according to the aspect of the invention), and a control device (an example of the determination means according to the aspect of the invention). The carrier stoppers 35 are used to stop the carriers 40. The cylinders 37 respectively move the carrier stoppers 35 toward the carriers 40. The control device drives the carrier stoppers 35 and checks whether the carriers 40 are positioned.

Each of the carrier stoppers 35 has a comb shape and has a plurality of protrusions 35*a*. As shown in FIG. 2, the carrier stoppers 35 are arranged respectively at both ends of the heating furnace 13 in the direction D2 so as to extend in the transport direction D1. Although not shown in the drawing, two carrier stoppers 35 are provided at each end of the heating furnace 13, that is, four carrier stoppers 35 are provided in total. The protrusions 35*a* are formed at equal intervals in the longitudinal direction of each carrier stopper 35. The interval of the adjacent protrusions 35*a* is desirably sufficiently wider than the width of the carrier 40 in the transport direction D1. For example, in the present embodiment, the width of the carrier 40 in the transport direction is about 120 mm, whereas the interval of the adjacent protrusions 35*a* is designed to about 125 mm. As a result, when the carriers 40 are engaged with the carrier stoppers 35, the carriers 40 are stopped at constant intervals (intervals of about 5 mm in the present embodiment) on the transport conveyors 20. Each carrier stopper 35 is fixed to the distal ends of two stopper shafts 36 provided to extend in the direction D2. Each stopper shaft 36 is supported reciprocably in the direction D2 by a shaft guide 38.

Each cylinder 37 is provided between the two shaft guides 38. Each cylinder 37 includes a piston rod 37*a* that is provided reciprocably in the direction D2. Then, the distal end of the piston rod 37*a* is coupled to the distal ends of the stopper shafts 36, located on both sides, by a connecting member 39. With the above configuration, as the cylinder 37 drives the piston rod 37*a* in the direction D2, the stopper shafts 36 coupled to the piston rod 37*a* via the connecting member 39 move the carrier stopper 35 in the direction D2. Each cylinder 37 according to the present embodiment is able to advance in two steps. This two-step advance action is implemented, for example, by providing two air chambers for an air cylinder or combining two cylinders in series with each other. Alternatively, by adjusting a moved distance using an electric cylinder, the above two-step advance action may be implemented. Note that each cylinder 37 according to the present embodiment is provided laterally with respect to the carrier stopper 35; instead, each cylinder 37 may be provided above the carrier stopper 35. In addition, when the halogen heaters 30 are, for example, provided at the upper portion of the heating furnace 13, each cylinder 37 should be provided below the carrier stopper 35 in terms of the influence of heat and installation space.

Figure 5:
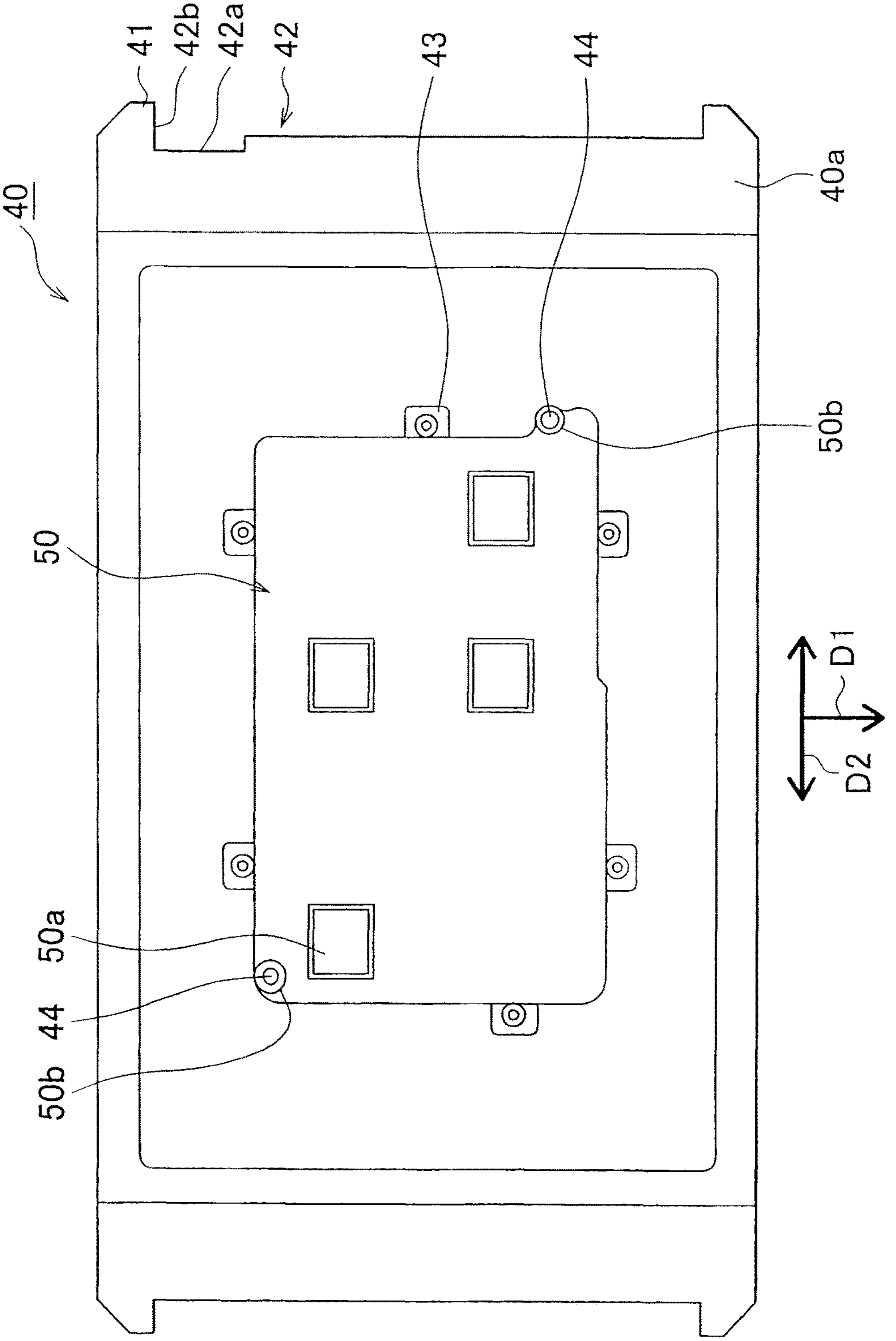
FIG. 5 is a plan view that shows a carrier provided for the carrier transport system according to the first embodiment of the invention.

The carrier 40 will be described with reference to FIG. 5. FIG. 5 is a plan view that shows the carrier provided for the carrier transport system according to the present embodiment. As shown in FIG. 5, the carrier 40 is a rectangular plate member made of aluminum. The carrier 40 includes two positioning pins 44 used for positioning a piece of work 50 and supported portions 40*a* supported by the transport rollers 21. The positioning pins 44 are provided so as to protrude upward from predetermined positions of the upper surface of the carrier 40. The supported portions 40*a* are provided at both end portions of the carrier 40 in the direction D2. As shown in FIG. 1 and FIG. 3, each supported portion 40*a* is bent upward and laterally to form a stepped shape, and is mounted on the transport rollers 21. Thus, as the drive motors 12 rotate the transport rollers 21, the supported portions 40*a* (carrier 40) are transported in the transport direction D1. In addition, each supported portion 40*a* has a cutout groove 42 (an example of the engagement portion according to the aspect of the invention).

The cutout groove 42 is provided between protrusions 41 that are formed to protrude laterally at both ends of the supported portion 40*a* in the direction D1. The cutout groove 42 is formed to be wider than each protrusion 35*a* of the carrier stopper 35. In addition, an insertion hole 42*a* is recessed in the direction D2 at the rear end portion in the transport direction D1 of one of the cutout grooves 42. The distal end of each protrusion 35*a* of the carrier stopper 35 can be inserted into the insertion hole 42*a*. Then, rear end surfaces 42*b* in the transport direction D1 of the respective cutout grooves 42 are surfaces that are brought into contact with the protrusions 35*a* of the carrier stoppers 35.

As shown in FIG. 2, the carrier transport system 10 according to the present embodiment includes temporary holding mechanisms 70 that temporarily hold the carrier 40 transported into the heating furnace 13. The temporary holding mechanisms 70 are provided downstream of the positioning mechanism in the carrier transport direction D1. Each of the temporary holding mechanisms 70 includes a temporary stopper 60 and a temporary holding cylinder 61. The temporary stopper 60 is brought into contact with the distal end portion in the transport direction of the first one carrier 40. The temporary holding cylinder 61 drives the temporary stopper 60 in the direction D2. A drive shaft 65 of each temporary holding cylinder 61 extends through a shaft hole 64 that is formed in a guide case 63 in the direction D2. In addition, the distal end of the drive shaft 65 is fixed to the temporary stopper 60. With the above configuration, as the temporary holding cylinder 61 drives the drive shaft 65 in the direction D2, the temporary stopper 60 is driven in the direction D2.

Figure 6B:
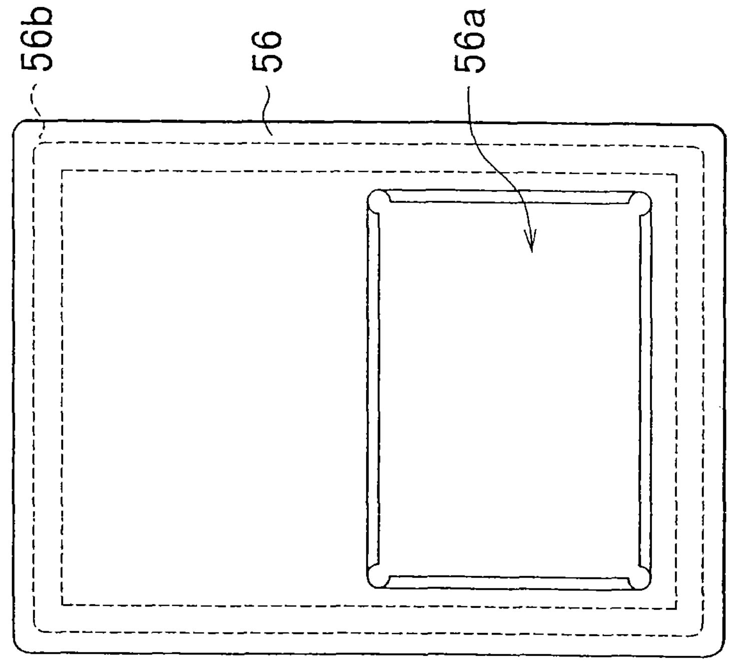
FIG. 6B is a top view of the jig placed on the mount portion provided for the carrier transport system according to the first embodiment of the invention.
Figure 6A:
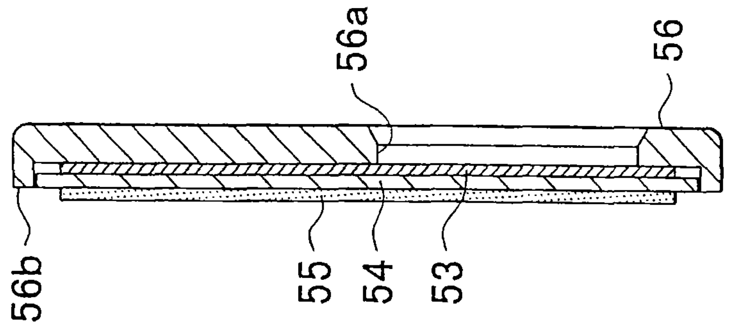
FIG. 6A is a side cross-sectional view of a jig placed on a mount portion provided for the carrier transport system according to the first embodiment of the invention.
Figure 7B:
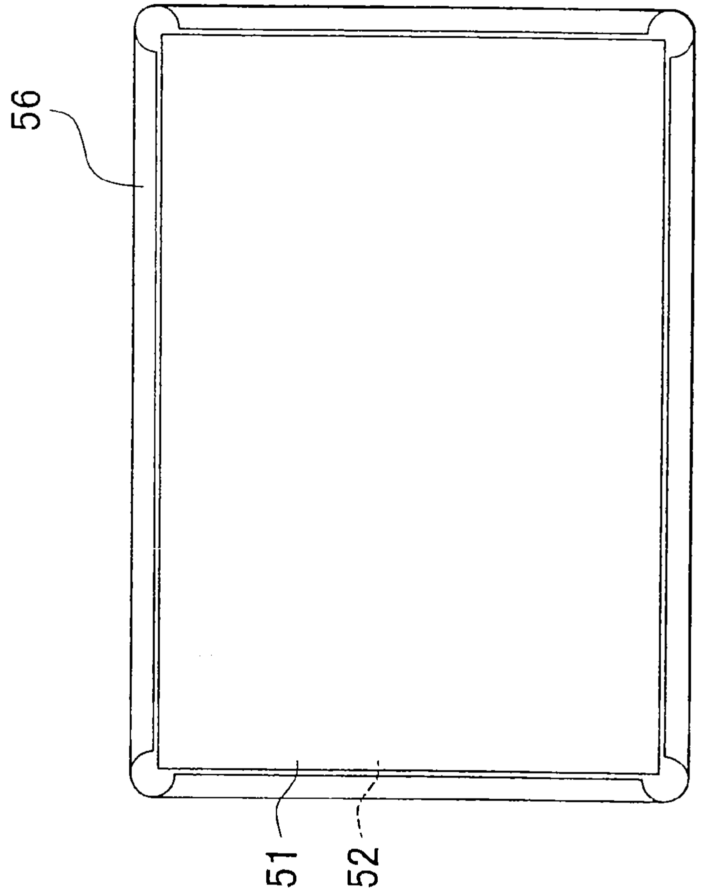
FIG. 7B is a top view of the solder foil and element that are arranged on the mount portion provided for the carrier transport system according to the first embodiment of the invention.
Figure 7A:
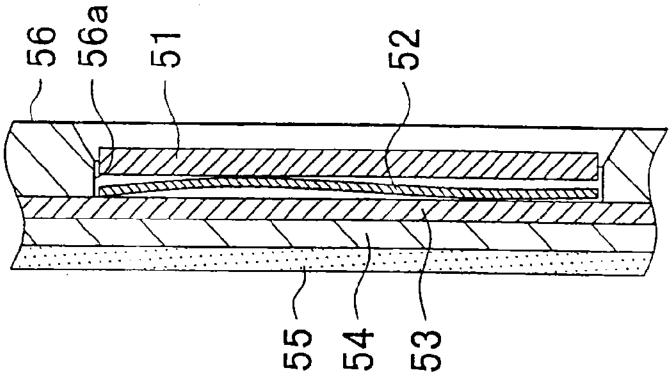
FIG. 7A is a side cross-sectional view of a solder foil and element that are arranged on the mount portion provided for the carrier transport system according to the first embodiment of the invention.

Next, the piece of work 50 transported by the carrier transport system 10 according to the present embodiment will be described with reference to FIG. 5 to FIG. 7B. FIG. 6A is a side cross-sectional view of a jig placed on a mount portion provided for the carrier transport system according to the present embodiment. FIG. 6B is a top view of the jig placed on the mount portion provided for the carrier transport system according to the present embodiment. FIG. 7A is a side cross-sectional view of a solder foil and element that are arranged on the mount portion provided for the carrier transport system according to the present embodiment. FIG. 7B is a top view of the solder foil and element that are arranged on the mount portion provided for the carrier transport system according to the present embodiment. The present embodiment refers to a case in which an inverter component is used as the piece of work 50. As shown in FIG. 5, the inverter component 50 is mounted on the carrier 40 via a heat insulating material 43. The inverter component 50 includes pin holes 50*b* and mount portions 50*a*. The pin holes 50*b* are used for positioning. The mount portions 50*a* are used to arrange elements 51. The pin holes 50*b* are provided at positions corresponding to the positioning pins 44 provided for the carrier 40. In addition, a jig 56 for holding the element 51 is attached to each mount portion 50*a*.

The jig 56 is made of carbon. As shown in FIG. 6B, the jig 56 includes an arrangement hole 56*a* for arranging the element 51, or the like, inside and an outer frame 56*b* for positioning the jig 56. As shown in FIG. 6A, an insulating substrate 54 is brazed onto the upper surface of the mount portion 50*a* using brazing filler metal 55, and an aluminum pattern 53 is formed on the upper surface of the insulating substrate 54. In addition, as shown in FIG. 7A and FIG. 7B, the element 51 is arranged inside the arrangement hole 56*a* via a solder foil 52. Note that a method of bonding the insulating substrate 54 is not limited to brazing; instead, another method of bonding, such as soldering, may be used.

Figure 8:
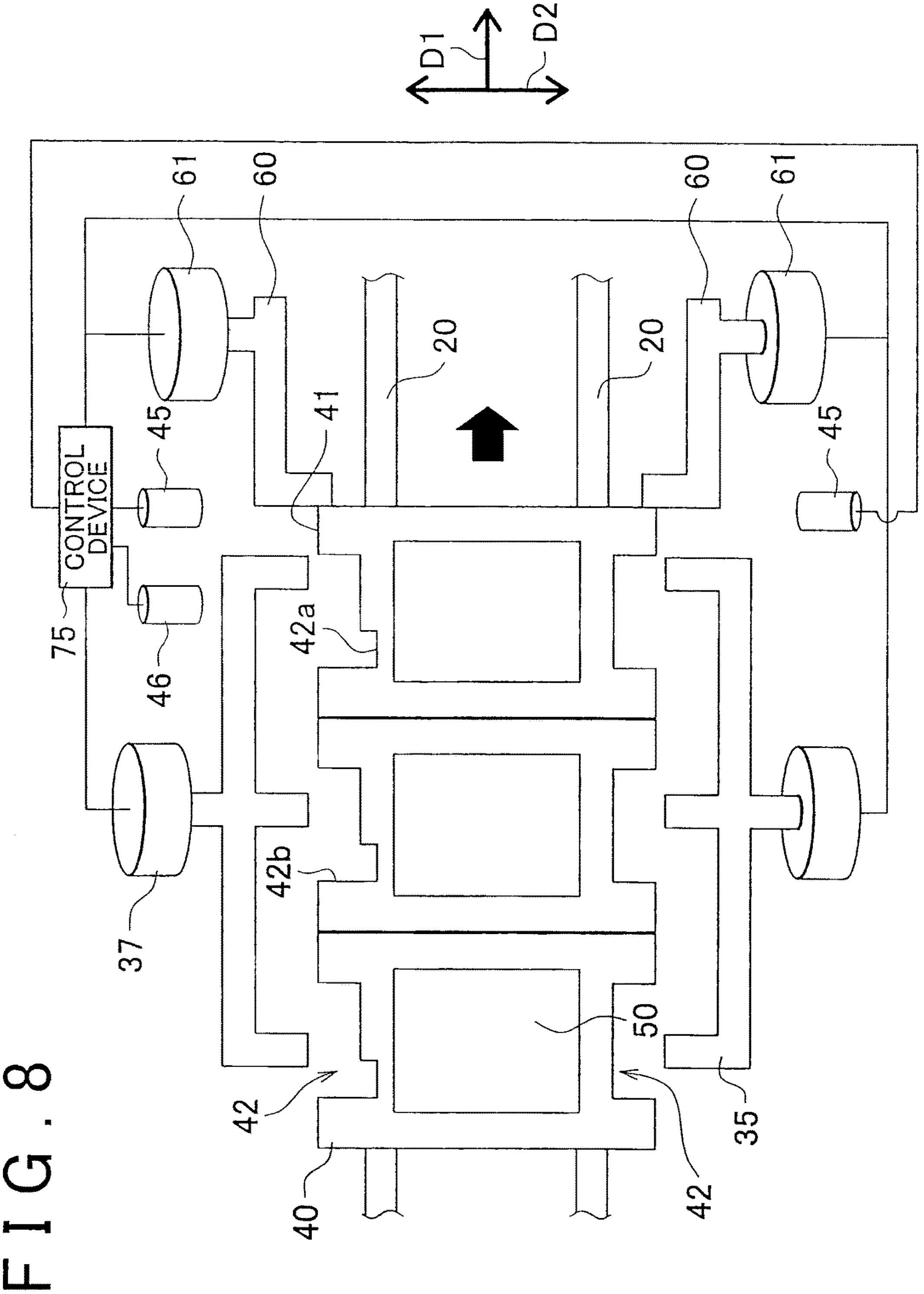
FIG. 8 is a view that illustrates a first step of positioning carriers according to the first embodiment of the invention.

Next, a control device 75 provided for the carrier transport system according to the present embodiment will be described with reference to FIG. 8. FIG. 8 is a view that illustrates a first step of positioning the carriers according to the present embodiment. As shown in FIG. 8, the control device 75 includes a moved distance detection sensor 46 (an example of the moved distance detecting means according to the aspect of the invention) and proximity detection sensors 45. The moved distance detection sensor 46 detects a moved distance of the carrier stopper 35 that is moved by the cylinder 37. The proximity detection sensors 45 detect proximity of the carriers 40 in the transport direction D1. Then, on the basis of information acquired from these sensors 45 and 46, the control device 75 drives the carrier stoppers 35 and the temporary stoppers 60, and checks whether the carriers 40 have been positioned. Note that a laser irradiation device that uses a phototube, or the like, may be, for example, used as each sensor.

Figure 9:
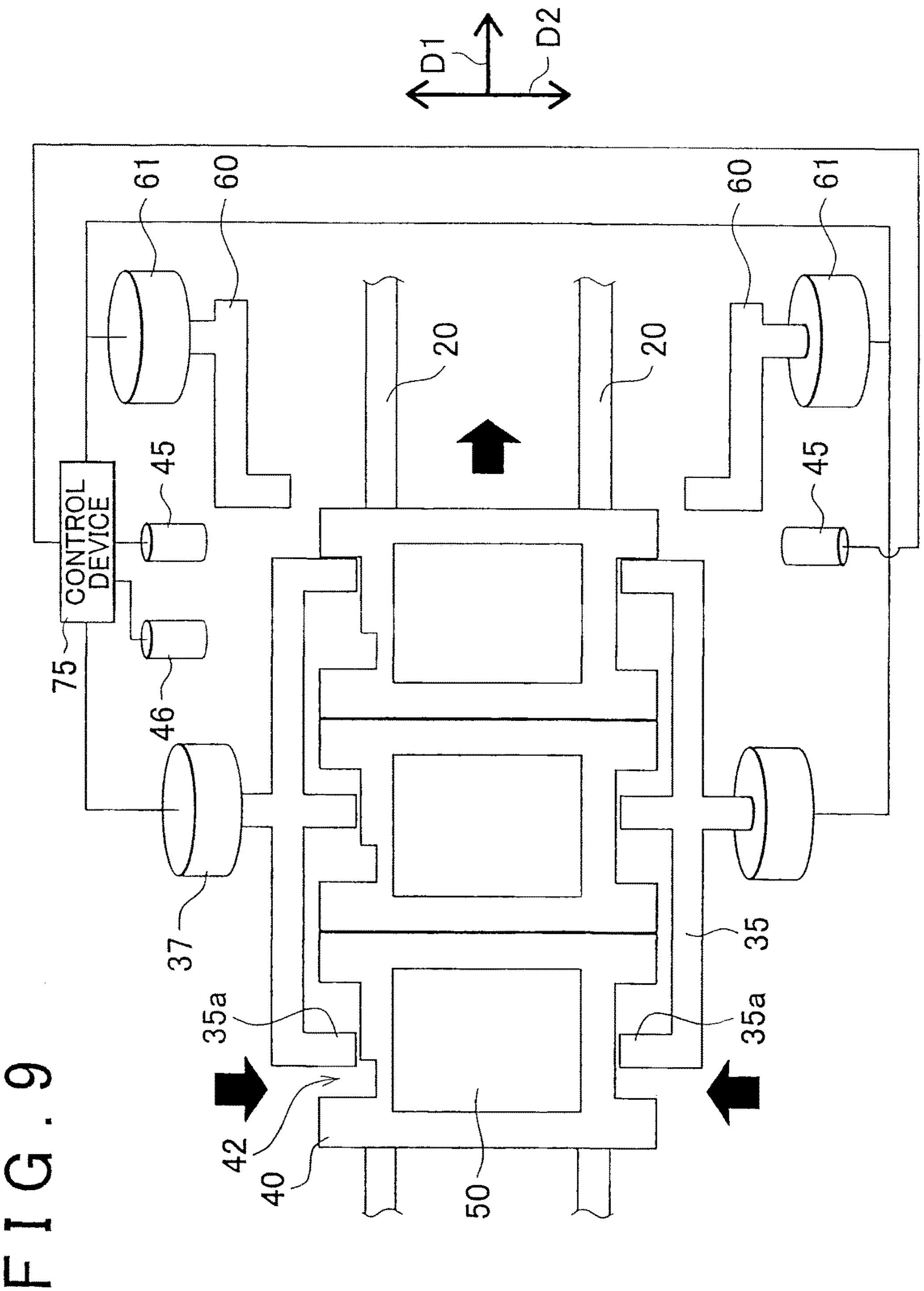
FIG. 9 is a view that illustrates a second step of positioning the carriers according to the first embodiment of the invention.
Figure 10:
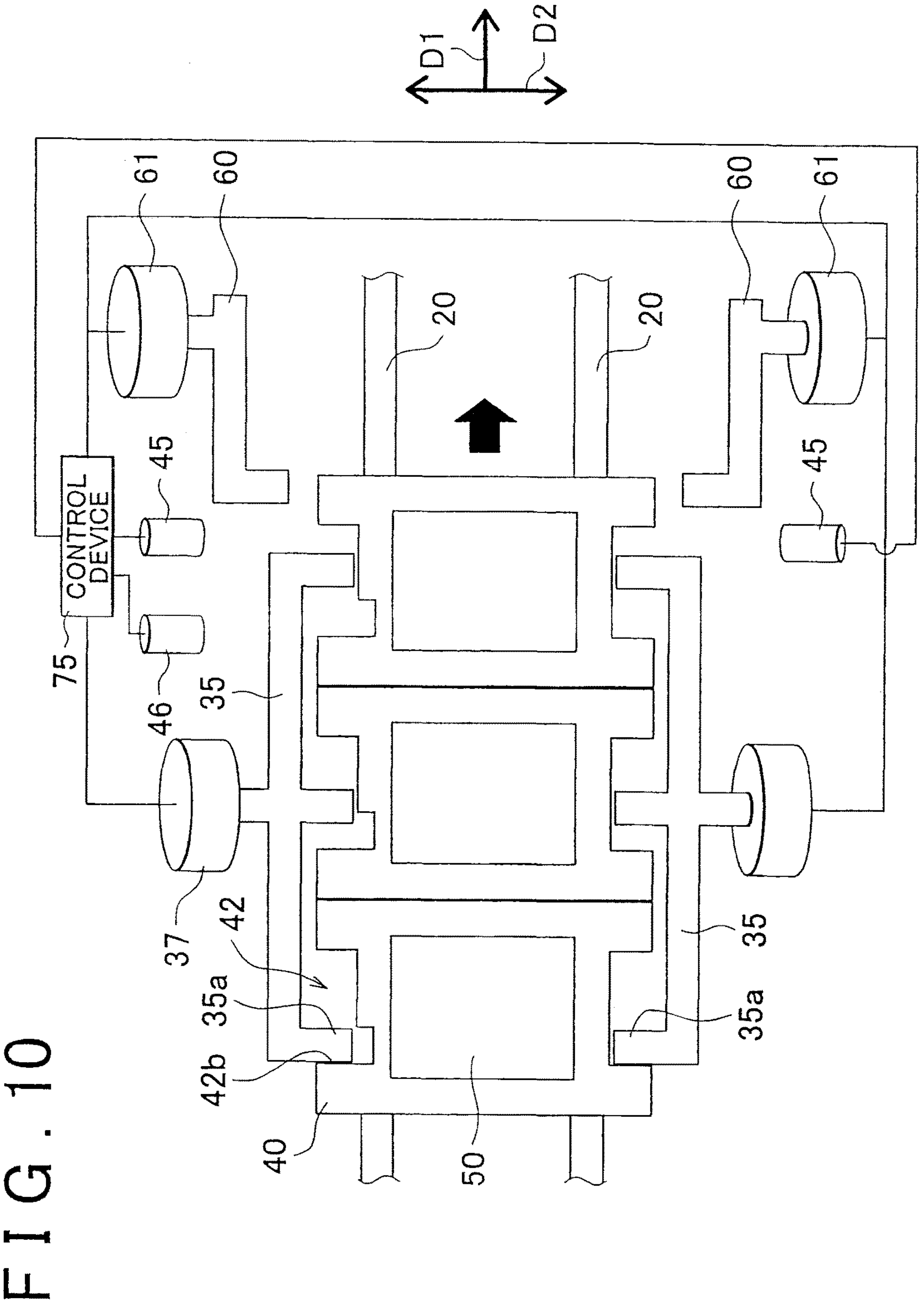
FIG. 10 is a view that illustrates a third step of positioning the carriers according to the first embodiment of the invention.
Figure 11:
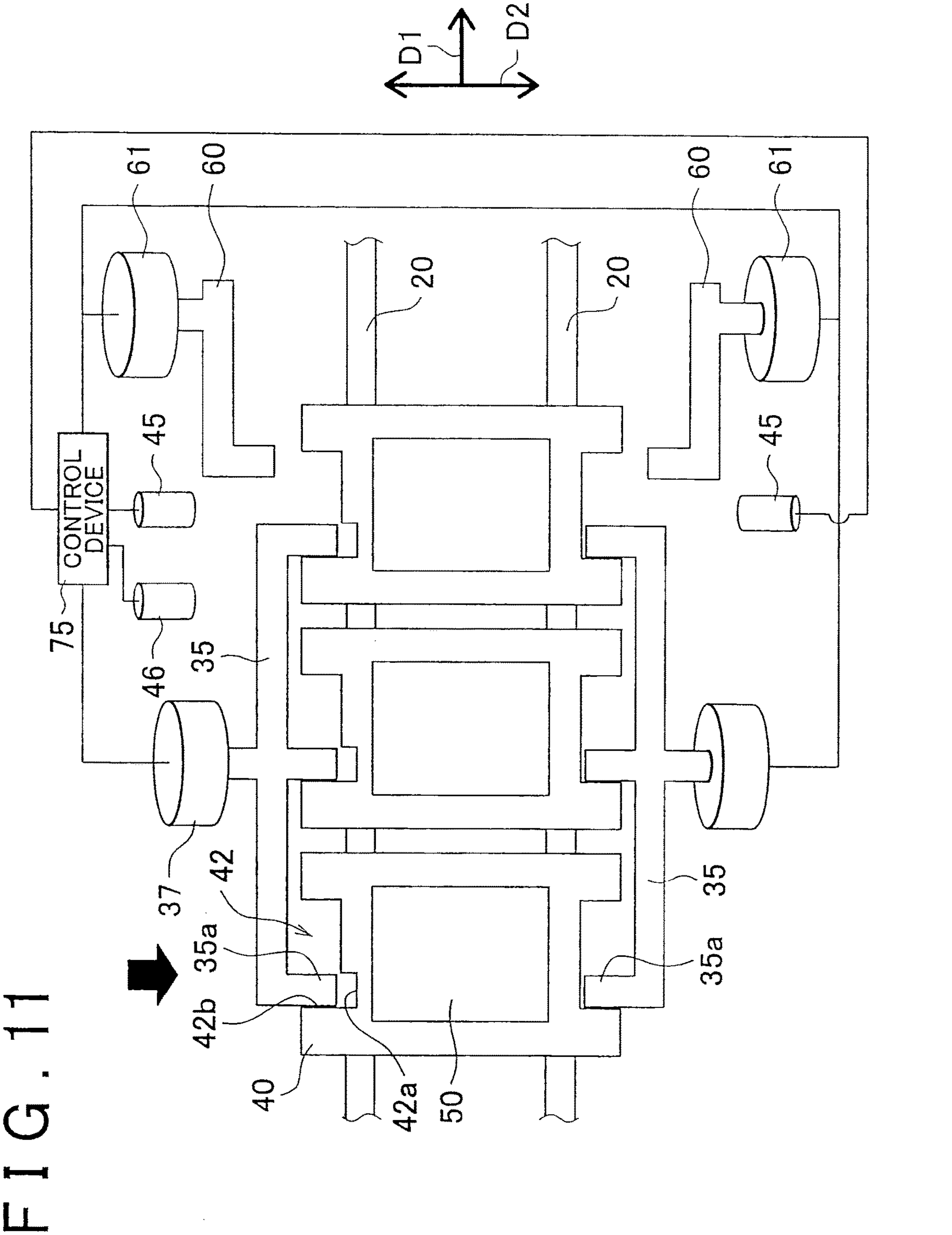
FIG. 11 is a view that illustrates a fourth step of positioning the carriers according to the first embodiment of the invention.
Figure 12:
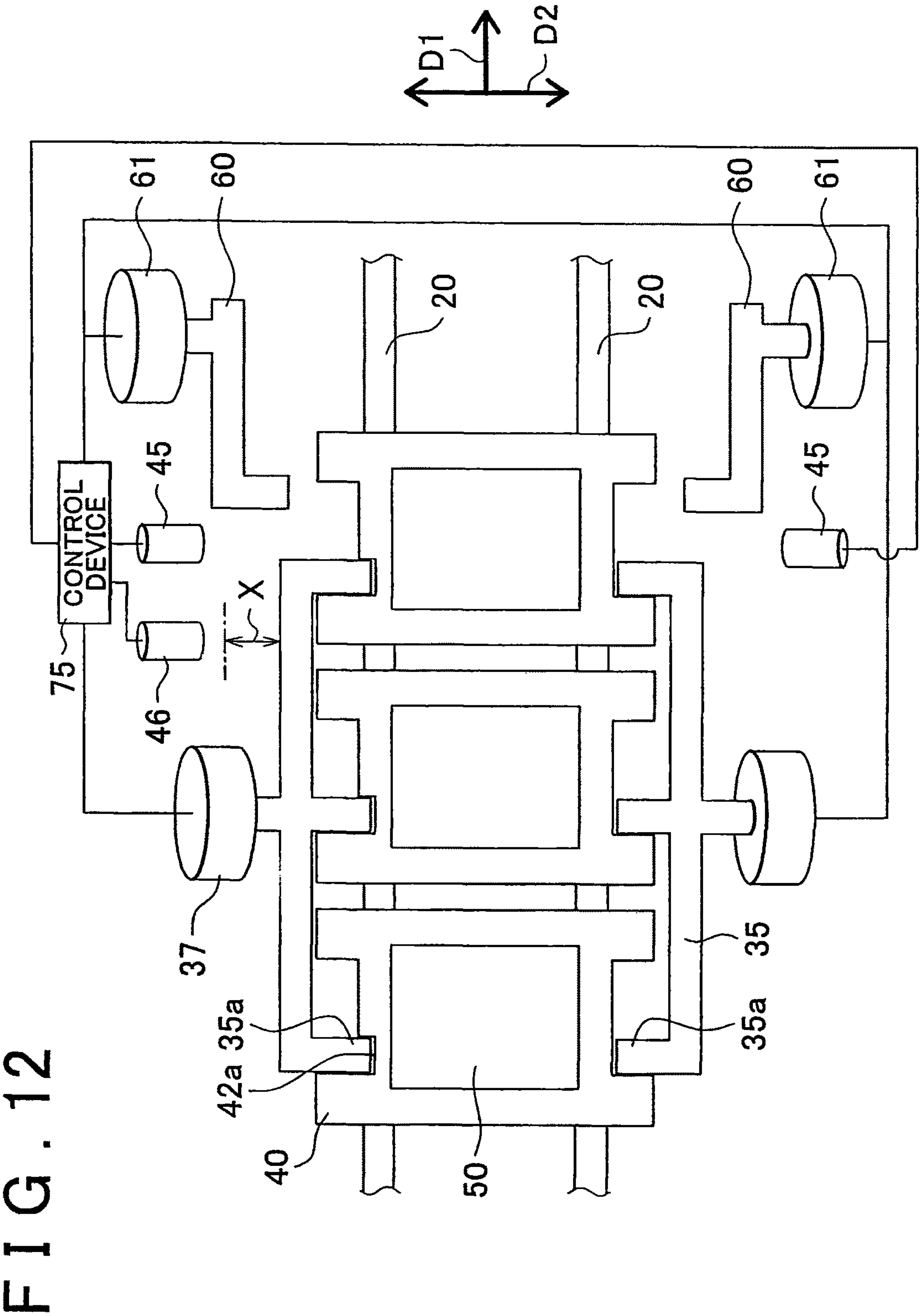
FIG. 12 is a view that illustrates a fifth step of positioning the carriers according to the first embodiment of the invention.
Figure 13:
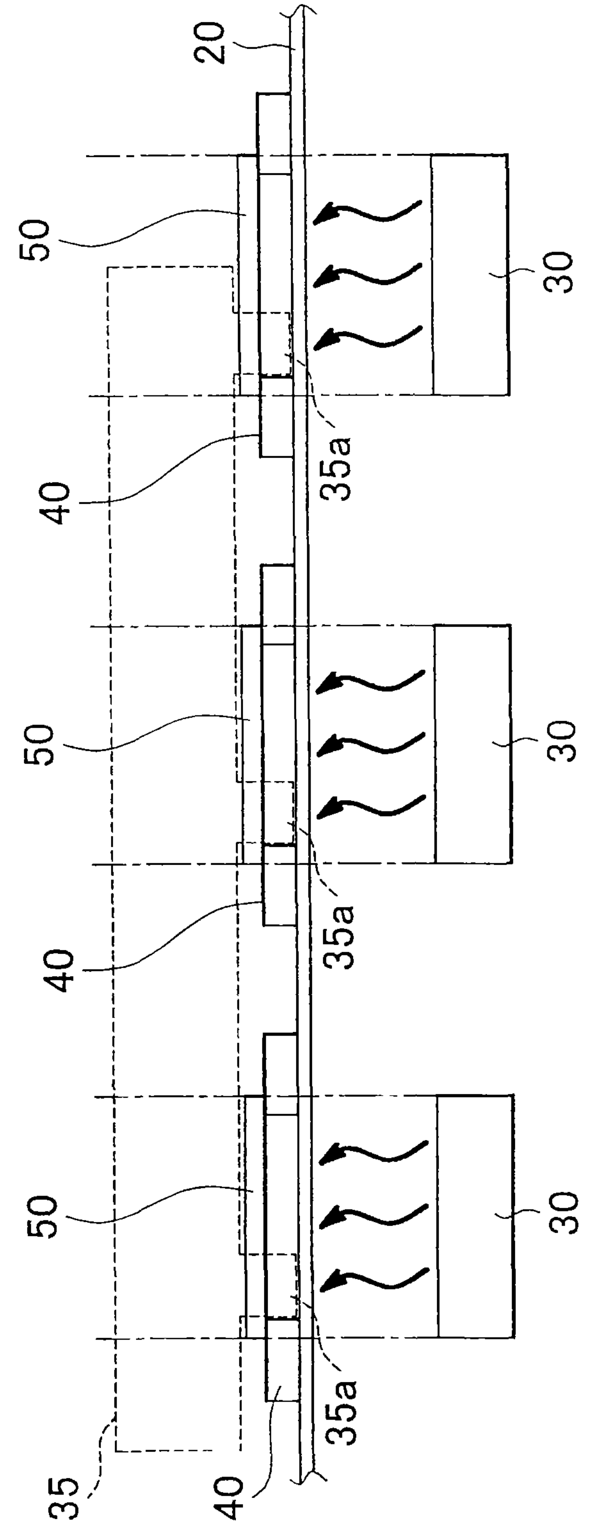
FIG. 13 is a side view that shows a state where the carriers are positioned by carrier stoppers according to the first embodiment of the invention.

Next, how the inverter component 50 is treated in the heating furnace using the above configured carrier transport system 10 will be described in detail with reference to FIG. 8 to FIG. 13. FIG. 9 is a view that illustrates a second step of positioning the carriers according to the present embodiment. FIG. 10 is a view that illustrates a third step of positioning the carriers according to the present embodiment. FIG. 11 is a view that illustrates a fourth step of positioning the carriers according to the present embodiment. FIG. 12 is a view that illustrates a fifth step of positioning the carriers according to the present embodiment. FIG. 13 is a side view that shows a state where the carriers are positioned by the carrier stoppers according to the present embodiment.

In the carrier transport system 10, the inverter components 50 are respectively mounted on the carriers 40 before the carriers 40 are transported into the heating furnace 13. At this time, by inserting the positioning pins 44 of the carrier 40 into the pin holes 50*b* of the inverter component 50, the inverter component 50 may be accurately positioned to the carrier 40. Then, after the inverter components 50 are mounted respectively on the carriers 40, the carriers 40 are transported by the transport conveyors 20 into the heating furnace 13. Then, the carriers 40 transported into the heating furnace 13 are positioned by the positioning mechanism of the carrier transport system 10 in according with the following first to fifth steps.

In the first step, as shown in FIG. 8, the carrier transport system 10 drives the temporary holding cylinders 61 by the control device 75 to advance the temporary stoppers 60 toward the transport path of the carriers 40 beforehand. After that, the carrier transport system 10 drives the transport conveyors 20 to transport the carriers 40 into the heating furnace 13. Then, the first one carrier 40 stops as the protrusions 41 thereof contacts the temporary stoppers 60, and then the subsequent carriers 40 also contact the preceding carriers 40 to stop at predetermined positions. The control device 75 uses the proximity detection sensors 45 to detect that the carriers 40 have reached the predetermined positions. Then, the carrier transport system 10 uses the control device 75 to check the proximity of the carriers 40, and then stops the transport conveyors 20.

With the carrier transport system 10, the proximity of the carriers 40 transported by the transport conveyors 20 is detected by the proximity detection sensors 45, and it is possible to accurately determine that the carriers 40 are transported to the predetermined positions on the basis of the detected information. Thus, in the next second step, the carrier stoppers 35 may be advanced toward the carriers 40 at an adequate timing. As a result, it is possible to prevent interference between the carrier stoppers 35 and the carriers 40 and further accurately position the carriers 40. Note that it is also applicable that a deceleration sensor is provided upstream of the proximity detection sensors 45 in the transport direction D1 and then a transport speed at which the carriers 40 are transported by the transport conveyors 20 is reduced when the deceleration sensor detects the proximity of the carriers 40. By so doing, it is possible to temporarily stop the carriers 40 by the temporary stoppers 60 further reliably.

In the second step, as shown in FIG. 9, the carrier transport system 10 uses the control device 75 to drive the cylinders 37 to advance the carrier stoppers 35, located on both sides, toward the carriers 40. At this time, in the carrier transport system 10, the cutout grooves 42 of the carriers 40 are wider in the transport direction D1 of the carriers 40 than the protrusions 35*a* of the carrier stoppers 35. Thus, the protrusions 35*a* may be easily inserted into the cutout grooves 42 by advancing the carrier stoppers 35 toward the carriers 40.

Each of the protrusions 35*a* of the carrier stoppers 35 is inserted into a middle portion in the transport direction (front portion in the transport direction in the case of the first one carrier 40) of the corresponding cutout groove 42 of the carrier 40. In this way, by inserting the protrusions 35*a* of the carrier stoppers 35 into the middle portions in the transport direction of the cutout grooves 42 of the carriers 40, the protrusions 35*a* may be reliably inserted into the cutout grooves 42 of the carriers 40. In addition, the control device 75 drives the temporary holding cylinders 61 in synchronization with the cylinders 37, and recedes the temporary stoppers 60 to the sides opposite to the transport path of the carriers 40.

In the third step, as shown in FIG. 10, the carrier transport system 10 uses the transport conveyors 20 to further move the carriers 40 in the transport direction D1. Then, the carriers 40 sequentially stop from the ones at the upstream side in the transport direction D1 in such a manner that the rear end surfaces 42*b* in the transport direction of the cutout grooves 42 are brought into contact with the protrusions 35*a* of the carrier stoppers 35. As a result, the carriers 40 are positioned at predetermined intervals in the transport direction D1 at a time. Here, in the present embodiment, the carriers 40 are positioned so that the carriers 40 respectively face the halogen heaters 30. Therefore, the inverter components 50 mounted respectively on the carriers 40 may be adequately heated by the halogen heaters 30 without waste. Moreover, the carriers 40 are positioned from both sides with respect to the transport direction D1. Thus, it is possible to further accurately position the carriers 40.

In the fourth step, as shown in FIG. 11, after all the carriers 40 have been positioned, the carrier transport system 10 uses the control device 75 to drive the cylinders 37 to advance one of the carrier stoppers 35 further toward the carriers 40. By so doing, the distal ends of the protrusions 35*a* of the one of the carrier stoppers 35 are inserted into the insertion holes 42*a* provided in the cutout grooves 42 of the carriers 40. Note that at this time, the carrier stoppers 35 may be advanced to positions at which the carrier stoppers 35 hold the carriers 40. In this way, by holding the carriers 40 with the carrier stoppers 35, the carriers 40 may be positioned in the direction D2. Thus, the inverter components 50 mounted respectively on the carriers 40 may be further accurately arranged so that the inverter component 50 respectively face the halogen heaters 30 in the heating furnace 13. As a result, the inverter components 50 may be further adequately heated without waste.

In the fifth step, as shown in FIG. 12, after the distal ends of the protrusions 35*a* have been inserted into the insertion holes 42*a*, the control device 75 of the carrier transport system 10 determines, on the basis of a moved distance X of the carrier stopper 35 detected by the moved distance detection sensor 46, whether the carriers 40 are properly positioned. At this time, a total moved distance of a moved distance in the second step and a moved distance in the fourth step is used as the moved distance X of the carrier stopper 35. Instead, only a moved distance in the fourth step may be used as the moved distance X of the carrier stopper 35. Then, the control device 75 determines that the carriers 40 are properly positioned when the moved distance X of the carrier stopper 35 exceeds a predetermined reference value. On the other hand, the control device 75 determines that the carriers 40 are not properly positioned when the moved distance of the carrier stopper 35 is smaller than or equal to the predetermined reference value. The reference value may be a moved distance of the carrier stopper 35 at the time when the distal ends of the protrusions 35*a* start to be inserted into the insertion holes 42*a*.

With the carrier transport system 10, the distal end of the protrusion 35*a* of the carrier stopper 35 cannot be inserted into the insertion hole 42*a* of the carrier 40 that is not properly positioned. Therefore, the carrier stopper 35 can be advanced toward the carriers 40 only when all the carriers 40 are positioned accurately. Thus, even when only one of the carriers 40 is inaccurately positioned, the moved distance X of the carrier stopper 35 is smaller than or equal to the reference value. Hence, it is possible to detect that the carriers 40 are not positioned accurately. Note that the carrier transport system 10 positions the carriers again when the carrier transport system 10 detects that the carriers 40 are not positioned accurately. By so doing, the carrier transport system 10 is able to further accurately position the carriers 40.

After the carrier transport system 10 detects that all the carriers 40 are accurately positioned, the carrier transport system 10 stops the transport conveyors 20. Then, as shown in FIG. 13, the carrier transport system 10 starts heating the inverter components 50 by the halogen heaters 30. As the inverter components 50 are heated by the halogen heaters 30, the solder foil 52 provided on each inverter component 50 melts. After that, the carrier transport system 10 releases positioning of the carriers 40 and drives the transport conveyors 20 to transport the carriers 40 out from the exit of the heating furnace 13. In each of the inverter components 50 transported to the outside of the heating furnace 13, the solder foil 52 is cooled and solidified, and the element 51 is soldered to the inverter component 50.

Here, in the present embodiment, the carriers 40 are made of aluminum. Then, when the inverter components 50 are heated by the halogen heaters 30, the carriers 40 are also heated to about a little below 400° C. Because of the above heating, the carriers 40 made of aluminum expand by about several millimeters. Thus, when the plurality of carriers 40 are arranged adjacent to each other in the heating furnace 13, the carriers 40 are influenced by the expansion from each other and are deviated in position. As a result, there is a possibility that the inverter components 50 may not be exposed equally to infrared rays irradiated from the halogen heaters 30. In contrast, in the carrier transport system 10, the carriers 40 are positioned at the predetermined intervals in the transport direction D1 at a time so that the carriers 40 respectively face the halogen heaters 30. By so doing, the carrier transport system 10 prevents the influence due to the expansion of each carrier 40 on the other carriers 40 to make it possible to suppress a positional deviation of each carrier 40 due to the expansion. As a result, it is possible to equally heat the inverter components 50 by the halogen heaters 30.

Note that in the present embodiment, the third step is performed after the second step has been completed; instead, the second step and the third step may be performed in parallel with each other. In addition, in the present embodiment, advance of the carriers 40 is once stopped after the second step has been completed and then the carriers 40 are advanced again in the fourth step; instead, the second step and the fourth step may be continuously performed.

As described in detail above, with the carrier transport system 10 according to the present embodiment, by determining whether the carriers 40 are properly positioned, even when the carriers 40 are not positioned accurately because, for example, the carriers 40 get caught on something, it is possible to detect the inaccurate positioning and then position the carriers 40 again. By so doing, it is possible to, for example, appropriately process or treat the inverter components 50 mounted respectively on the carriers 40. In addition, the plurality of carriers 40 may be positioned at a time and then the positioning may be checked, so working efficiency is favorable.

Furthermore, the carrier transport system 10 detects the moved distance X of the carrier stopper 35 to check whether the carriers 40 are positioned accurately. Thus, it is not necessary to provide a plurality of position detecting means (position sensors, or the like) in correspondence with the carriers 40. Therefore, it is not necessary to ensure a large space in the side surface of the chamber 17 of the heating furnace 13 to form a plurality of quartz windows. As a result, it is possible to position the plurality of carriers 40 in the heating furnace 13 at a time and to check whether all the carriers 40 are positioned accurately with a simple configuration.

Figure 14:
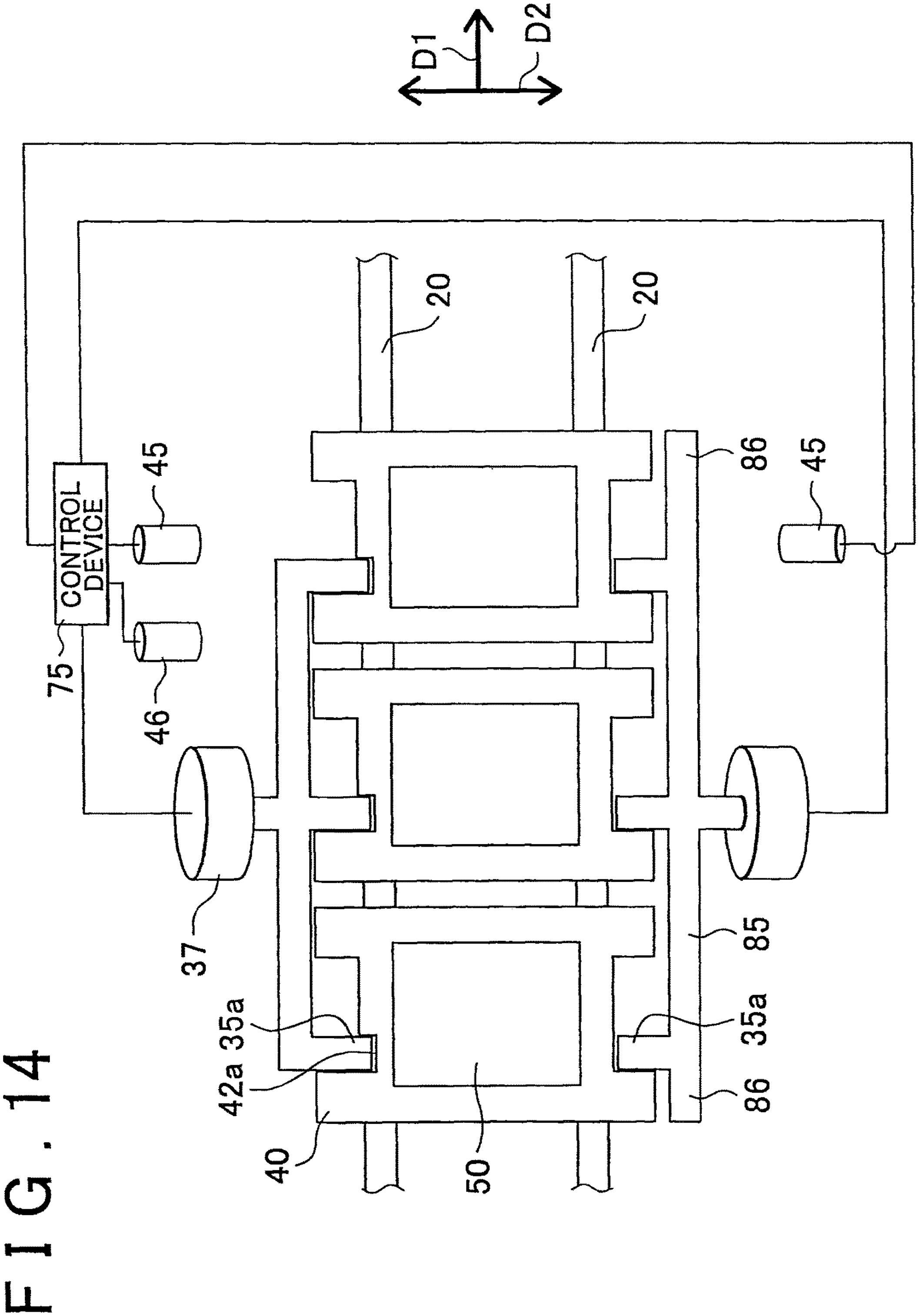
FIG. 14 is a schematic configuration diagram that shows a carrier transport system according to a second embodiment of the invention.

Next, a carrier transport system according to a second embodiment of the invention will be described with reference to FIG. 14. FIG. 14 is a schematic configuration diagram that shows the carrier transport system according to the second embodiment. Note that in the carrier transport system according to the second embodiment, like reference numerals in the drawing denote like components to those of the first embodiment, and the description thereof is omitted where appropriate, and then the difference will be mainly described below. The carrier transport system according to the second embodiment differs from the first embodiment in the shape of one of carrier stoppers. That is, as shown in FIG. 14, a carrier stopper 85 has rotation preventing portions 86, which contact parts of the carriers 40 to prevent rotation of the carriers 40. The rotation preventing portions 86 are formed to extend from both ends of the carrier stopper 85 in the longitudinal direction.

In the carrier transport system, when the carriers 40 rotate, parts of the carriers 40 contact the rotation preventing portions 86 of the carrier stopper 85. Thus, rotation of the carriers 40 may be suppressed. In this manner, it is possible to further accurately position the carriers 40, so the inverter components 50 may be further accurately arranged so that the inverter components 50 respectively face the halogen heaters 30. As a result, the inverter components 50 may be further adequately heated without waste. Note that in FIG. 14, the rotation preventing portions 86 are provided only for the one carrier stopper 85; instead, the rotation preventing portions 86 may be provided for the carrier stoppers located on both sides. By so doing, the carriers 40 may be further accurately positioned.

Figure 15:
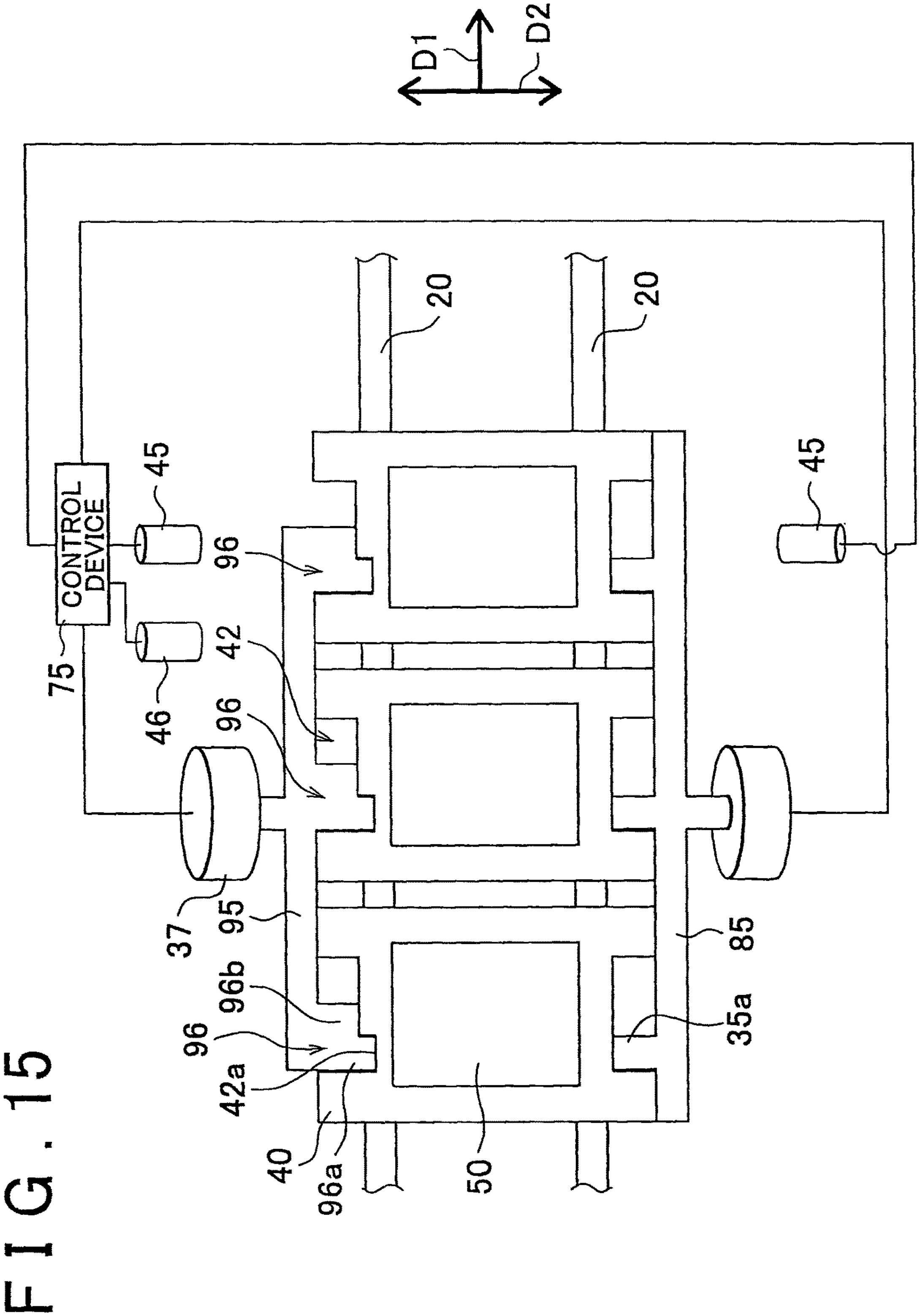
FIG. 15 is a schematic configuration diagram that shows a carrier transport system according to a third embodiment of the invention.

Next, a carrier transport system according to a third embodiment of the invention will be described with reference to FIG. 15. FIG. 15 is a schematic configuration diagram that shows the carrier transport system according to the third embodiment. Note that in the carrier transport system according to the third embodiment, like reference numerals in the drawing denote like components to those of the above embodiments, and the description thereof is omitted where appropriate, and then the difference will be mainly described below. The carrier transport system according to the third embodiment differs from the above embodiments in the shape of protrusions provided for one of carrier stoppers. That is, as shown in FIG. 15, protrusions 96 of a carrier stopper 95 located on one side according to the present embodiment each have an insertion portion *96a* and a contact portion *96b*. The insertion portion *96a* is inserted into the insertion hole *42a*. The contact portion *96b* contacts a bottom surface of the cutout groove 42.

In this carrier transport system, the insertion portions *96a* and contact portions *96b* of the protrusions 96 of the one carrier stopper 95 and the protrusions *35a* of the other carrier stopper 85 are used to be able to hold the carriers 40. In this way, by holding the carriers 40, it is possible to effectively suppress a positional deviation of each carrier 40 in the direction D2 and rotation of each carrier 40.

Note that the above embodiments are just illustrative and are not intended to limit the invention, and the above embodiments may be, of course, variously modified or improved without departing from the scope of the invention. For example, in the above embodiments, the carrier stopper 35, 85 or 95 approaches the carriers 40 laterally with respect to the transport conveyor 20; instead, the carrier stopper 35, 85 or 95 may approach the carriers 40 from the upper side with respect to the transport conveyor 20. In addition, the shape of the cutout groove 42 of each carrier 40 or the shape of the protrusion *35a* or 96 of each carrier stopper 35, 85 or 95 may be freely changed depending on a mode for positioning, or the like. Furthermore, the carrier transport system according to the above embodiments may be used to position the carriers 40 outside the heating furnace 13.

While the invention has been described with reference to example embodiments thereof, it should be understood that the invention is not limited to the example embodiments or constructions. To the contrary, the invention is intended to cover various modifications and equivalent arrangements. In addition, while the various elements of the example embodiments are shown in various combinations and configurations, which are exemplary, other combinations and configurations, including more, less or only a single element, are also within the spirit and scope of the invention.

The invention claimed is:

1. A carrier transport system comprising:

a plurality of carriers on which pieces of work are respectively mounted;

a transport conveyor that transports the plurality of carriers;

a heating furnace that covers part of the transport conveyor and that heats the pieces of work; and a positioning portion that positions the plurality of carriers in the heating furnace, wherein:

the heating furnace includes a plurality of heating devices for heating the pieces of work inside so that the plurality of heating devices are arranged at predetermined intervals in a transport direction in which the carriers are transported, each of the carriers has at least one engagement portion, and the positioning portion includes a comb-shaped carrier stopper having a plurality of protrusions that are engageable with the engagement portions of the respective carriers;

an actuating portion that moves the carrier stopper toward the carriers in order to engage the protrusions with the engagement portions;

a moved distance detecting portion that detects a moved distance of the carrier stopper moved by the actuating portion; and a determination portion that determines, on the basis of the moved distance detected by the moved distance detecting portion, whether the carriers are properly positioned, wherein the engagement portions of the respective carriers are cutout grooves that are wider in the transport direction of the carriers than the protrusions, rear end portions in the transport direction of the cutout grooves respectively have insertion holes that allow distal ends of the protrusions to be inserted, and the actuating portion may advance the carrier stopper so as to engage the protrusions with the cutout grooves and insert the distal ends of the protrusions into the insertion holes in coordination with transport operation of the transport conveyor, wherein the determination portion determines that the carriers are properly positioned when the moved distance exceeds a predetermined reference value, the reference value being a moved distance of the carrier stopper at a time when the distal ends of the protrusions start to be inserted into the insertion holes.

2. The carrier transport system according to claim 1, wherein after the protrusions are moved by the actuating portion to be inserted into the cutout grooves, the transport conveyor is transported to engage rear end surfaces in the transport direction of the cutout grooves of the carriers with the protrusions, and then the protrusions are moved by the actuating portion toward the carriers again to insert the distal ends of the protrusions into the insertion holes.

3. The carrier transport system according to claim 1, further comprising:

a proximity detection sensor that detects proximity of the carriers; and a control portion that controls the actuating portion to drive the carrier stopper on the basis of information detected by the proximity detection sensor.

4. The carrier transport system according to claim 3, further comprising:

a temporary holding mechanism that temporarily holds the carrier transported into the heating furnace, wherein the control portion controls a temporary stopper to drive the temporary holding mechanism.

5. The carrier transport system according to claim 1, wherein the engagement portion of each carrier is provided at each end in a direction that intersects with the transport direction, and the carrier stopper is provided on each side in a direction that intersects with the transport direction.

6. The carrier transport system according to claim 5, wherein the actuating portion advances at least one of the carrier stoppers, located on both sides, toward the carriers to hold the carriers by the carrier stoppers located on both sides.

7. The carrier transport system according to claim 5, wherein at least one of the carrier stoppers located on both sides includes a rotation preventing portion that contacts parts of the carriers to prevent rotation of the carriers.

8. The carrier transport system according to claim 5, wherein:

the engagement portion of each carrier is provided at each end in a direction that intersects with the transport direction in a horizontal direction, and the carrier stopper is provided on each side in a direction that intersects with the transport direction in a horizontal direction.

9. The carrier transport system according to claim 1, further comprising a temporary holding mechanism that temporarily holds the carrier transported into the heating furnace.

10. The carrier transport system according to claim 1, wherein:

depths of the insertion holes are longer than depths of the cutout grooves; and the actuating portion may advance the carrier stopper so as to engage each of the protrusions with each of the cutout grooves.

11. A carrier transport system comprising:

a plurality of carriers on which pieces of work are respectively mounted;

a transport conveyor that transports the plurality of carriers;

a heating furnace that covers part of the transport conveyor and that heats the pieces of work; and a positioning portion that positions the plurality of carriers in the heating furnace, wherein:

the heating furnace includes a plurality of heating devices for heating the pieces of work inside so that the plurality of heating devices are arranged at predetermined intervals in a transport direction in which the carriers are transported, each of the carriers has at least one engagement portion, and the positioning portion includes a comb-shaped carrier stopper having a plurality of protrusions that are engageable with the engagement portions of the respective carriers;

an actuating portion that moves the carrier stopper toward the carriers in order to engage the protrusions with the engagement portions;

a moved distance detecting portion that detects a moved distance of the carrier stopper moved by the actuating portion;

a determination portion that determines, on the basis of the moved distance detected by the moved distance detecting portion, whether the carriers are properly positioned;

the engagement portions of the respective carriers are cutout grooves that are wider in the transport direction of the carriers than the protrusions;

rear end portions in the transport direction of the cutout grooves respectively have insertion holes that allow distal ends of the protrusions to be inserted;

the actuating portion may advance the carrier stopper so as to engage the protrusions with the cutout grooves and insert the distal ends of the protrusions into the insertion holes in coordination with transport operation of the transport conveyor;

the moved distance detecting portion detects a first moved distance that the protrusions of the carrier stopper move into the cutout grooves and a second moved distance that the protrusions of the carrier stopper move into the insertion holes; and the determination portion determines, on the basis of the second moved distance detected by the moved distance detecting portion, whether the carriers are properly positioned.

* * * * *